United States Patent
Steckel et al.

(10) Patent No.: US 8,080,437 B2
(45) Date of Patent: Dec. 20, 2011

(54) BLUE LIGHT EMITTING SEMICONDUCTOR NANOCRYSTAL MATERIALS

(75) Inventors: Jonathan S. Steckel, Cambridge, MA (US); John P. Zimmer, Cambridge, MA (US); Seth Coe-Sullivan, Belmont, MA (US); Nathan E. Stott, Albuquerque, NM (US); Vladimir Bulović, Lexington, MA (US); Moungi G. Bawendi, Cambridge, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 1210 days.

(21) Appl. No.: 11/819,413

(22) Filed: Jun. 27, 2007

(65) Prior Publication Data

US 2011/0229998 A1    Sep. 22, 2011

Related U.S. Application Data

(62) Division of application No. 11/071,244, filed on Mar. 4, 2005, now Pat. No. 7,253,452.

(60) Provisional application No. 60/550,314, filed on Mar. 8, 2004.

(51) Int. Cl.
  *H01L 33/00* (2010.01)
(52) U.S. Cl. ........ 438/46; 438/22; 257/79; 257/94; 257/103; 257/E33.002
(58) Field of Classification Search ........ 257/79, 257/94, 103, E33.002; 977/720, 721; 438/22, 438/46
See application file for complete search history.

(56) References Cited

U.S. PATENT DOCUMENTS

| | | | |
|---|---|---|---|
| 5,147,841 | A | 9/1992 | Wilcoxon |
| 5,262,357 | A | 11/1993 | Alivisatos et al. |
| 5,293,050 | A | 3/1994 | Chapple-Sokol et al. |
| 5,354,707 | A | 10/1994 | Chapple-Sokol et al. |
| 5,422,489 | A | 6/1995 | Bhargava |
| 5,434,878 | A | 7/1995 | Lawandy |
| 5,492,080 | A | 2/1996 | Ohkawa |
| 5,499,260 | A | 3/1996 | Takahashi et al. |
| 5,505,928 | A | 4/1996 | Alivisatos et al. |
| 5,515,393 | A | 5/1996 | Okuyama et al. |
| 5,525,377 | A | 6/1996 | Gallagher et al. |
| 5,537,000 | A | 7/1996 | Alivisatos et al. |
| 5,541,948 | A | 7/1996 | Krupke et al. |
| 5,585,640 | A | 12/1996 | Huston et al. |
| 5,606,163 | A | 2/1997 | Huston et al. |
| 5,625,456 | A | 4/1997 | Lawandy |

(Continued)

FOREIGN PATENT DOCUMENTS

WO    WO 97/10175    3/1997

(Continued)

OTHER PUBLICATIONS

Aktsipetrov, O.A., et al. "Generation of reflected second harmonic at semiconductor quantum dots," *JETP Letters*, vol. 55, No. 8, 435-439 (1992).

(Continued)

*Primary Examiner* — Victor A Mandala
(74) *Attorney, Agent, or Firm* — Steptoe & Johnson LLP

(57) ABSTRACT

A semiconductor nanocrystal includes a core including a first semiconductor material and an overcoating including a second semiconductor material. A monodisperse population of the nanocrystals emits blue light over a narrow range of wavelengths with a high quantum efficiency.

20 Claims, 14 Drawing Sheets

U.S. PATENT DOCUMENTS

| | | | |
|---|---|---|---|
| 5,677,545 | A | 10/1997 | Shi et al. |
| 5,747,180 | A | 5/1998 | Miller et al. |
| 5,751,018 | A * | 5/1998 | Alivisatos et al. ............ 257/64 |
| 5,985,173 | A | 11/1999 | Gray et al. |
| 5,985,353 | A | 11/1999 | Lawton et al. |
| 5,990,479 | A | 11/1999 | Weiss et al. |
| 6,054,495 | A | 4/2000 | Markowitz et al. |
| 6,057,561 | A | 5/2000 | Kawasaki et al. |
| 6,103,868 | A | 8/2000 | Heath et al. |
| 6,114,038 | A | 9/2000 | Castro et al. |
| 6,157,047 | A | 12/2000 | Fujita et al. |
| 6,179,912 | B1 | 1/2001 | Barbera-Guillem et al. |
| 6,207,229 | B1 | 3/2001 | Bawendi et al. |
| 6,224,739 | B1 | 5/2001 | Reetz et al. |
| 6,251,303 | B1 | 6/2001 | Bawendi et al. |
| 6,262,129 | B1 | 7/2001 | Murray et al. |
| 6,294,401 | B1 | 9/2001 | Jacobson et al. |
| 6,306,610 | B1 | 10/2001 | Bawendi et al. |
| 6,322,901 | B1 | 11/2001 | Bawendi et al. |
| 6,337,117 | B1 | 1/2002 | Maenosono et al. |
| 6,379,635 | B2 | 4/2002 | O'Brien et al. |
| 6,501,091 | B1 | 12/2002 | Bawendi et al. |
| 6,548,171 | B1 | 4/2003 | Barbera-Guillem et al. |
| 6,576,291 | B2 | 6/2003 | Bawendi et al. |
| 6,592,842 | B2 | 7/2003 | Elder et al. |
| 6,607,829 | B1 | 8/2003 | Bawendi et al. |
| 6,783,569 | B2 | 8/2004 | Cheon et al. |
| 6,794,265 | B2 * | 9/2004 | Lee et al. .................. 438/409 |
| 6,815,064 | B2 | 11/2004 | Treadway et al. |
| 6,819,692 | B2 | 11/2004 | Klimov et al. |
| 6,821,337 | B2 | 11/2004 | Bawendi et al. |
| 6,846,565 | B2 | 1/2005 | Korgel et al. |
| 6,861,155 | B2 | 3/2005 | Bawendi et al. |
| 6,872,450 | B2 | 3/2005 | Liu et al. |
| 7,056,471 | B1 | 6/2006 | Han et al. |
| 7,374,824 | B2 * | 5/2008 | Bawendi et al. ............ 428/570 |
| 2001/0005495 | A1 | 6/2001 | O'Brien et al. |
| 2001/0038900 | A1 | 11/2001 | Todori et al. |
| 2002/0066401 | A1 | 6/2002 | Peng et al. |
| 2002/0144644 | A1 | 10/2002 | Zehnder et al. |
| 2003/0017264 | A1 | 1/2003 | Treadway et al. |
| 2003/0042850 | A1 | 3/2003 | Bertram et al. |
| 2003/0142944 | A1 * | 7/2003 | Sundar et al. ................. 385/131 |
| 2004/0017834 | A1 * | 1/2004 | Sundar et al. .................. 372/39 |
| 2004/0023010 | A1 * | 2/2004 | Bulovic et al. ............... 428/209 |
| 2005/0012182 | A1 | 1/2005 | Jang et al. |
| 2006/0057382 | A1 * | 3/2006 | Treadway et al. ........... 428/403 |
| 2011/0177586 | A1 * | 7/2011 | Ismagilov et al. ......... 435/287.2 |

FOREIGN PATENT DOCUMENTS

| | | |
|---|---|---|
| WO | WO 98/19963 | 5/1998 |
| WO | WO 99/26299 | 5/1999 |
| WO | WO 2005/004253 | 1/2005 |

OTHER PUBLICATIONS

Alivisatos, A.P. "Semiconductor Clusters, Nanocrystals, and Quantum Dots," Science 1996, 271, 933-937.

Bailey, R.E., et al. "Alloyed Semiconductor Quantum Dots: Tuning the Optical Properties without Changing the Particle Size," J. Am. Chem. Soc. 2003, 125, 7100-7106.

Baltrameyunas, R., et al., "Fast switching of the transmission of light by glasses activated with CdS microcrystals," *Sov. Phys. Semicond.*, vol. 25 No. 2, 164-166 (1991).

Baltramiejunas, R., et al. "Rapid Processes of Darkening and Bleaching in CdS Doped Glasses," *Superlattices and Microstructures* vol. 10, No. 3, 307-310 (1990).

Battaglia, D. et al. "Formation of High Quality InP and InAs Nanocrystals in a Noncoordinating Solvent," Nano. Lett. 2002, 2, 1027-1030.

Bhargava, R.N., et al., "Quantum Confined Atoms of Doped ZnO Nanocrystals", *Phys. Stat. Sol* (b) 229, No. 2, 897-901 (2002).

Bruchez Jr., M., et al. "Semiconductor Nanocrystals as Fluorescent Biological Labels," Science 1998,281, 2013-2016.

Bunge, S.D. et al. "Growth and morphology of cadmium chalcogenides: the synthesis of nanords, tetrapods, and spheres from CdO and Cd($O_2CCH_3$)$_2$," J. Mater. Chem, 2003, 13, 1705-1709.

Chamarro, M., et al., "Enhancement of electron-hole exchange interaction in CdSe nanocrystals; A quantum confinement effect," *Physical Review B*, vol. 53, No. 3, Jan. 15, 1996-I, 1336-1342.

Chamarro, M., et al., "Enhancement of Exciton Exchange Interaction by Quantum Confinement in CdSe Nanocrystals," *Jpn. J. Appl. Phys*, vol. 34, 12-14 (1994).

Chamarro, M., et al., "Size-dependent Electron-Hole Exchange Interaction in CdSe Quantum Dots, *Il Nuovo Cimento*," vol. 17, Nos. 11-12, (1995) 1407-1412.

Chan, W.C.W., et al, Science 1998 281, 2016.

Chan, W.C.W., et al. "Luminescent quantum dots for multiplexed biological detection and imaging," Curr. Opin. Biotech. 2002, 13, 40-46.

Chen et al., "Colloidal ZnSe, ZnSe/ZnS, and ZnSe/ZnSeS Quantum Dots Synthesized from ZnO," J. Phys. Chem. B, 108, 17119 -17123, 2004.

Chepic, D.I., et al., "Auger ionization of semiconductor quantum drops in a glass matrix," *Journal of Luminescence* 47 (1990) 113-127 North-Holland.

Coe, S., et al., "Electroluminescence from single monolayers of nanocrystals in molecular organic devices," Nature 2002, 420, 800-803.

Coe-Sullivan, "Hybrid Organic/Quantum Dot Thin Film Structures and Devices", Thesis, Massachusetts Institute of Technology Department of Electrical Engineering and Computer Science, Jun. 2005.

Coe-Sullivan, S., et al., Org. Electron. 2003, 4, 123.

Colvin, V.L., et al., "Light-emitting diodes made from cadmium selenide nanocrystals and a semiconducting polymer," Nature 1994, 370, 354-357.

Cumberland, S.L., et al., "Inorganic Clusters as Single-Source Precursors for Preparation of CdSe, ZnSe, and CdSe/ZnS Nanomaterials," Chem. Mater. 2002, 14,1576-1584.

Dabbousi, B.O., et al., "(CdSe)ZnS Core-Shell Quantum Dots: Synthesis and Characterization of a Size Series of Highly Luminescent Nanocrystallites," J. Phys. Chem. B 1997, 101, 9463-9475.

Dabbousi, B.O., et al., "Electroluminescence from CdSe quantum-dot/polymer composites," Appl. Phys. Lett. 1995, 66, 1316-1318.

Dneproviskii, V.S., et al., "Time-Resolved Luminescence of CdSe Microcrystals," *Solid State Communications*, vol. 74, No. 7, pp. 555-557, 1990.

Edamatsu, K., et al., "Subpicosecond dynamics of confined excitons and optical nonlinearities of CuCl quantum dots," *Journal of Luminescence* 66 & 67 (1996) 406-409.

Efros, A.L., et al., "Resonance Raman Spectroscopy of Electron-Hole Pairs—Polar Phonon Coupling in Semiconductor Quantum Microcrystals," *Solid State Communications*, vol. 78, No. 10, pp. 853-856, 1991.

Ekimov, A. I., et al., "Absorportion and intensity-dependent photoluminescence measurements on CdSe quantum dots: assignment of the first electronic transitions," *Journal of the Optical Society of America*, vol. 10, Nos. 1-12, 100-107 (1992).

Ekimov, A., et al., " Growth of CdSe nanocrystals in ion-implanted $SiO_2$ films," *Journal of Crystal Growth* 151 (1995) 38-45.

Ekimov, A.I., "Growth and optical properties of semiconductor nanocrystals in a glass matrix," *Journal of Luminescence* 70 (1996) 1-20.

Ekimov, A.I., "Optical Properties of Oxide Glasses Doped by Semiconductor Nanocrystals," *Radiation Effects and Defects in Solids*, 1995, vol. 134, pp. 11-22.

Ekimov, A.I., "Optical Properties of Semiconductor Quantum Dots in Glass Matrix," *Physica Scripta*. vol. T39, 217-222 (1991).

Ekimov, A.I., et al. "Dimensional Effects in Luminescence Spectra of Zero-Dimensional Semiconductor Structures," *Bulletin of the Russian Academy of Sciences*, vol. 56, No. 2, pp. 154-157, Feb. 1992.

Ekimov, A.I., et al., "Spectra and Decay Kinetics of Radiative Recombination in CdS Microcrystals," *Journal of Luminescence* 46 (1990) 83-95 North-Holland.

Ekimov, A.I., et al., "Donor-like Exciton in Zero-Dimension Semiconductor Structures," *Solid State Communications*, vol. 69, No. 5, pp. 565-568, 1989.

Ekimov, A.I., et al., "Influence of high hydrostatic pressures on the exciton spectrum of CdS microcrystals in glass," *Sov. Phys. Semicond.* 23(9), Sep. 1989, pp. 965-966.

Ekimov, A.I., et al., "Nonlinear Optics of Semiconductor-Doped Glasses," *Phys. Stat. Sol.* (b) 150, (1988) pp. 627-633.

Ekimov, A.I., et al., "Optics of Zero Dimensional Semiconductor Systems, *Acta Physica Polonica A*," vol. 79 (1991), No. 1. pp. 5-14.

Ekimov, A.I., et al., "Photoluminescence of quasizero-dimensional semiconductor structures," *Sov. Phys. Solid State* 31(8), Aug. 1989, pp. 1385-1393.

Ekimov, A.I., et al., "Quantization of the energy spectrum of holes in the adiabatic potential of the electron," *JETP Lett.*, vol. 43, No. 6, Mar. 25, 1986, pp. 376-379.

Ekimov, A.I., et al., "Quantum Size Effect in Semiconductor Microcrystals," *Solid State Communications*, vol. 56, No. 11, pp. 921-924, 1985.

Ekimov, A.I., et al., "Quantum size effect in the optical spectra of semiconductor microcrystals," *Sov. Phys. Semicond.* 16(7), Jul. 1982, pp. 775-778.

Ekimov, A.I., et al., "Quantum size effect in three-dimensional microscopic semiconductor crystals," *JETP Lett*, vol. 34, No. 6, Sep. 20, 1981, pp. 345-349.

Ekimov, A.I., et al., "Quantum-Size Stark Effect in Semiconductor Microcrystals," *Journal of Luminescence* 46 (1990) 97-100 North-Holland.

Ekimov, A.I., et al., "Size quantization of the electron energy spectrum in a microscopic semiconductor crystal," *JETP Lett.*, vol. 40, No. 8, Oct. 25, 1984, pp. 1136-1139.

Gao, X., et al., "Quantum Dot-Encoded Mesoporous Beads with High Brightness and Uniformity: Rapid Readout Using Flow Cytometry," Anal. Chem. 2004, 76, 2406-2410.

Gaponik, N., et al., "Thiol-Capping of CdTe Nanocrystals: An Alternative to Organometallic Synthetic Routes," J. Phys. Chem. B 2002, 7177-7185.

Grabovskis, V.Y., et al., "Photoionization of semiconducting microcrystals in glass," *Sov. Phys. Solid State* 31(1), Jan. 1989, pp. 149-151.

Guha, S., et al., "Hybrid organic-inorganic semiconductor-based light-emitting diodes," J. Appl. Phys., 1997, 82, 4126-4128.

Gurevich, S.A., et al. "Preparation and investigation of $SIO_2$ films activated by CdS semiconductor nanocrystals," *Soviet Physics Semiconductors*, vol. 26, 57-59 (1992).

Gurevich, S.A., et al., "Growth of CdS nanocrystals in silicate glasses and in thin $SIO_2$ films in the Initial states of the phase separation of a solid solution," *Semiconductors*, 28 (5), May 1994, 486-493.

Han, M., et al., "Quantum-dot-tagged microbeads for multiplexed optical coding of biomolecules," Nat. Biotech. 2001, 19, 631-635.

Hines, M.A. et al., J. Phys. Chem. B 1998, 102, 3655.

Hines, M.A., et al., "Synthesis and Characterization of Strongly Luminescing ZnS-Capped CdSe Nanocrystals," J. Phys. Chem. 1996, 100, 468-471.

Itoh, T. et al., "Interface effects on the properties of confined excitons in CuCl microcrystals," *Journal of Luminescence* 60 & 61 (1994) 396-399.

Itoh, T., et al., "Polaron and Exciton-Phonon Complexes in CuCl Nanocrystals,"*Physical Review Letters*, vol. 74, No. 9, Feb. 27, 1995, p. 1645-1648.

Itoh, T., et al., "Subpicosecond dynamics of confined excitons in CuCl nanocrystals," *Materials Science and Engineering* A217/218 (1996) 167-170.

Jang et al., "High quality CdSeS nanocrystals synthesized by facile single injection process and their electroluminescence," Chem. Commun., 2003, 2964-2965.

Jarvis Jr., R.F., et al., "Solution Synthesis and Photoluminescence Studies of Small Crystallites of Cadmium Telluride," Mat. Res. Soc. Symp. Proc. 1992, 272, 229-234.

Jun et al., "Interfused semiconductor nanocrystals: brilliant blue photoluminescence and electroluminescence," Chem. Commun., 2005, 4616-4618.

Jursenas, S., et al., "Surface Recombination of Nonequilibrium Electron-Hole Plasma in Laser-Modified Semiconductor-Doped Glasses," *Solid State Communications*, vol. 87, No. 6, 577-580 (1993).

Kortan, A.R., et al., "Nucleation and Growth of CdSe on ZnS Quantum Crystallite Seeds, and Vice Versa, in Inverse Micelle Media," J. Am. Chem. Soc. 1990, 35 U.S.C. § 112, 1327-1332.

Kuno, M., et al., "The band edge luminescence of surface modified CdSe nanocrystallites: Probing the luminescent state," J. Chem. Phys. 1997, 106, 9869-9882.

Lee, J., et al., "Full Color Emission from II-VI Semiconductor Quantum Dot-Polymer Composites," Adv. Mater. 2000, 12, 1102-1105.

Li et al., High Quality ZnSe and ZnS Nanocrystals Formed by Activating Zinc Carboxylate Precursors, Nano Letters, 4 (11), 2261-2264, 2004.

Lomascolo et al., "Exciton relaxation processes in colloidal core/shell ZnSe/ZnS nanocrystals," Appl. Phys. Lett., 82 (3), 418-420 (2003).

Lublinskaya, O., et al., "CdS nanocrystal growth in thin silica films: evolution of size distribution function", *Journal of Crystal Growth* 184/185 (1998) 360-364.

Ludolph, B., et al., "Novel single molecule precursor routs for the direct synthesis of highly monodispersed quantum dots of cadmium or zinc sulfide or selenide," Chem. Commun. 1998, 1849-1850.

Matsumoto, H., et al., "Preparation of Monodisperse CdS Nanocrystals by Size Selective Photocorrosion," J. Phys. Chem. 1996, 100, 13781-13785.

Mattoussi, H., et al. "Electroluminescence from heterostructures of poly(phenylene vinylene) and inorganic CdSe nanocrystals," J. Appl. Phys. 1998, 83, 7965-7974.

Mattoussi, H., et al., J. Am. Chem. Soc. 2000, 122, 12142.

Mikulec, F.V., et al., "Synthesis and Characterization of Highly Luminescent (CdSe)ZnS Quantum Dots," Mat. Res. Soc. Symp. Proc. 1997, 452, 359-364.

Murray, C.B., et al., "Synthesis and Characterization of Nearly Monodisperse CdE (E=S, Se, Te) Semiconductor Nanocrystallites," J. Am. Chem. Soc. 1993, 115 8706-8715.

Peng, X., et al., "Epitaxial Growh of Highly Luminescent CdSe/CdS Core/Shell Nanocrystals with Photostability and Electronic Accessibility," J. Am. Chem. Soc. 1997, 119, 7019-7029.

Peng, X., et al., "Kinetics of II-VI and III-V Colloidal Semiconductor nanocrystal Growth: 'Focusing' of Size Distributions," J. Am. Chem. Soc. 1998, 120, 5343-5344.

Rajh, T., et al., "Synthesis and Characterization of Surface-Modified Colloidal CdTe Quantum Dots," J. Phys. Chem. 1993, 97, 11999-12003.

Resch, U., et al., "Photochemistry and Radiation Chemistry of Colloidal Semiconductors. 33. Chemical Changes and Fluorescence in CdTe and ZnTe," Langmuir 1989, 5, 1015-1020.

Rogach, A.L., et al., "Synthesis and Characterization of Thiol-Stabilized CdTe Nanocrystals," Ber. Bunsenges. Phys. Chem. 1996, 100, 1772-1778.

Saviot, L., et al., "Effects of Resonance on Low-Frequency Raman Scattering From Semiconductor Nanocrystals," *Radiation Effects and Defects in Solids*, 1995, vol. 137, pp. 45-50.

Saviot, L., et al., "Size dependence of acoustic and optical vibrational modes of CdSe nanocrystals in glasses," *Journal of Non-Crystalline Solids* 197 (1996) 238-246.

Saviot, L., et al., "Size-selective resonant Raman scattering in CdS doped glasses," *Physical Review B*, vol. 57, No. 1, 1 Jan. 1998-I, 341-346.

Schlamp, M.C., et al., "Improved efficiencies in light emitting diodes made with CdSe(CdS) core/shell type nanocrystals and a semiconducting polymer," J. Appl. Phys. 1997, 82, 5837-5842.

Sirenko, A.A., et al., "Spin-flip and acoustic-phonon Raman scattering in CdS nanocrystals", *Physical Review B*, vol. 58, No. 4, 15 (Jul. 1998-II), 2077-2087.

Spanhel, L., et al., "Photochemistry of Colloidal Semiconductors. 20. Surface Modificiation and Stability of Strong Luminescing CdS particles," J. Am. Chem. Soc. 1987, 109, 5649-5655.

Steckel, "The Synthesis of Inorganic Semiconductor Nanocrystalline Materials for the Purpose of Creating Hybrid Organic/Inorganic Light-Emitting Devices", Thesis, Massachusetts Institute of Technology Department of Chemistry, Feb. 2006.

Steckel, J.S., et al., "Blue Luminescence from (CdS)ZnS Core-Shell Nanocrystals," Angew. Chem. Int. Ed. 2004, 43, 2154-2158.

Steckel, J.S., et al., Adv. Mater. 2003, 15, 1862.

Steigerwald, M.L., et al., "Surface Derivatization and Isolation of Semiconductor Cluster Molecules," J. Am. Chem. Soc. 1988, 110, 3046-3050.

Talapin, D.V., et al., Nano Lett. 2001, 1, 207.

Tamulaitis, G., et al., "Dynamics of Nonlinear Optical Response of CuBr-Doped Glasses," *Superlattices and Microstructures*, vol. 3, No. 2, 199-202 (1993).

Tessler, N., et al., Science 2002, 295, 1506.

Valenta, J., et al., "Dynamics of excitons in CuBr nanocrystals: Spectral-hole burning and transient four-wave-mixing measurements," *Physical Review B*, vol. 57, No. 3, Jan. 15, 1998-I, 1774-1783.

Vandyshev, Y.V., et al., "Nonlinear optical properties of semiconductor microcrystals," *JETP Lett.*, vol. 46, No. 10, Nov. 25, 1987 pp. 435-439.

Volkov, A.S., et al., "Oscillations of polarization of recombination radiation of a variable gap semiconductor in a magnetic field," *JETP Lett.*, vol. 25 No. 55, 526-528 (1977).

Xie et al., "Synthesis and Characterization of Highly Luminescent CdSe-Core CdS/$Zn_{0.5}Cd_{0.5}$S/ZnS Multishell Nanocrystals," J. Am. Chem. Soc., 127, 7480-7488, 2005.

Yen, B.K.H., et al., Adv. Mater. 2003, 15, 1858.

Yu, W.W., et al., Angew. Chem. Int. Ed. 2002, 41, 2368.

Zhong et al., "Alloyed $Zn_xCd_{1-x}$ Nanocrystals with Highly Narrow Luminescence Spectral Width," J. Am. Chem. Soc., 125, 13559-13563, 2003.

Zhong et al., "Embryonic Nuclei-Induced Alloying Process for the Reproducible Synthesis of Blue-Emitting $Zn_xCd_{1-x}$Se Nanocrystals with Long-Time Thermal Stability in Size Distribution and Emission Wavelength," J. Phys. Chem. B, 108, 15552-15559, 2004.

Zhong et al., "High-Quality Violet- to Red-Emitting ZnSe/CdSe Core/Shell Nanocrystals," Chem. Mater. 2005, 17, 4038-4042.

Zhong, X., et al., "Composition-Tunable $Zn_xCd_{1-x}$Se Nanocrystals with High Luminescence and Stability," J. Am. Chem. Soc. 2003, 125, 8589-8594.

Coe, S., et al., "Electroluminescence from single monolayers of nanocrystals in molecular organic devices," Nature 2002, 420, 800-803.

Dabbousi, B.O., et al., "(CdSe)ZnS Core-Shell Quantum Dots: Synthesis and Characterization of a Size Series of Highly Luminescent Nanocrystallites," J. Phys. Chem. B 1997, 101, 9463-9475.

Jack, J. et al., "Large-scale synthesis of nearly monodisperse CdSe/CdS core/shell nanocrystals using air-stable reagents via successive ion layer adsorption and reaction." *JACS*, 2003, 125: 12567-12575.

* cited by examiner

BLUE LIGHT EMITTING SEMICONDUCTOR NANOCRYSTAL MATERIALS

CLAIM OF PRIORITY

This application is a divisional of and claims priority to U.S. patent application Ser. No. 11/071,244, filed on Mar. 4, 2005 now U.S. Pat. No. 7,253,452, which claims priority under 35 U.S.C. §119(e) to U.S. Patent Application No. 60/550,314, filed Mar. 8, 2004, each of which is incorporated by reference in its entirety

FEDERALLY SPONSORED RESEARCH OR DEVELOPMENT

The U.S. Government may have certain rights in this invention pursuant to Contract No. DMR 0213282 by the NSF, and Contract DAAD-19-02-0002 by the U.S. Army Research Office.

TECHNICAL FIELD

The invention relates to blue light emitting semiconductor nanocrystals.

BACKGROUND

Semiconductor nanocrystals having small diameters can have properties intermediate between molecular and bulk forms of matter. For example, nanocrystals based on semiconductor materials having small diameters can exhibit quantum confinement of both the electron and hole in all three dimensions, which leads to an increase in the effective band gap of the material with decreasing nanocrystal size. Consequently, both the optical absorption and emission of nanocrystals shift to the blue (i.e., to higher energies) as the size of the nanocrystals decreases. Semiconductor nanocrystals can have a narrow fluorescence band whose emission wavelength is tunable with the size and material of the nanocrystals.

SUMMARY

Stable, blue light emitting materials are highly desirable for color display applications. Luminescent semiconductor nanocrystals can be more stable than organic light emitting compounds. Semiconductor nanocrystals can also have narrow emission band widths compared to organic compounds.

Core-shell nanocrystal materials can be prepared that exhibit blue, narrow band edge luminescence. The materials can have quantum efficiencies at least 10%, at least 30%, or at least 50%, and emission band widths with a full width at half maximum of less than 40 nm, less than 30 nm, or less than 20 nm.

In one aspect, a semiconductor nanocrystal includes a core including a first semiconductor material, and an overcoating on the core, the overcoating including a second semiconductor material, wherein the nanocrystal is substantially free of deep-trap emission sites, and the nanocrystal when excited emits blue light.

In another aspect, a population of semiconductor nanocrystals, each nanocrystal of the population includes a core including a first semiconductor material, and an overcoating on the core, the overcoating including a second semiconductor material. Each nanocrystal is substantially free of deep-trap emission sites. The population when excited emits blue light.

The nanocrystal when excited can emit blue light with a quantum efficiency of at least 10%, at least 30%, or at least 50%. The blue light has a full width at half maximum of not more than 40 nm, not more than 30 nm, or not more than 20 nm. The blue light can have a peak wavelength shorter than 470 nm. The first semiconductor material can be CdS. The second semiconductor material can be ZnS. The blue light can have an intensity at least five times greater, at least ten times greater, or at least twenty times greater than an intensity of a deep trap emission.

The population can emit light with a quantum efficiency of at least 20%, at least 30%, at least 40%, or at least 50%. The population can emit light with a full width at half maximum of not more than 40 nm, not more than 30 nm, or not more than 20 nm.

In another aspect, a light emitting device includes a layer including a matrix, a first electrode adjacent to the layer, a second electrode opposed to the first electrode, and a plurality of semiconductor nanocrystals disposed between the first electrode and the second electrode. The semiconductor nanocrystals are substantially free of deep-trap emission sites. The nanocrystals when excited emit blue light.

In the light emitting device, the semiconductor nanocrystals can include a core including a first semiconductor material and an overcoating on the core, the overcoating including a second semiconductor material. The device can be capable of emitting light with a full width at half maximum of not more than 40 nm.

In yet another aspect, a method of making a nanocrystal includes contacting a monodisperse population of semiconductor nanocrystals with an M-containing compound, an X-donor, and an amine, at temperature sufficient to individually overcoat the nanocrystals. The overcoated nanocrystals are substantially free of deep-trap emission sites, and the overcoated nanocrystals when excited emit blue light.

The amine can be a primary alkenyl amine. The amine can be a $C_2$-$C_{20}$ primary alkenyl amine. The amine can be oleylamine. The monodisperse population of semiconductor nanocrystals can be a monodisperse population of CdS nanocrystals.

Other features, objects, and advantages will be apparent from the description and drawings, and from the claims.

DETAILED DESCRIPTION

Figure 1:
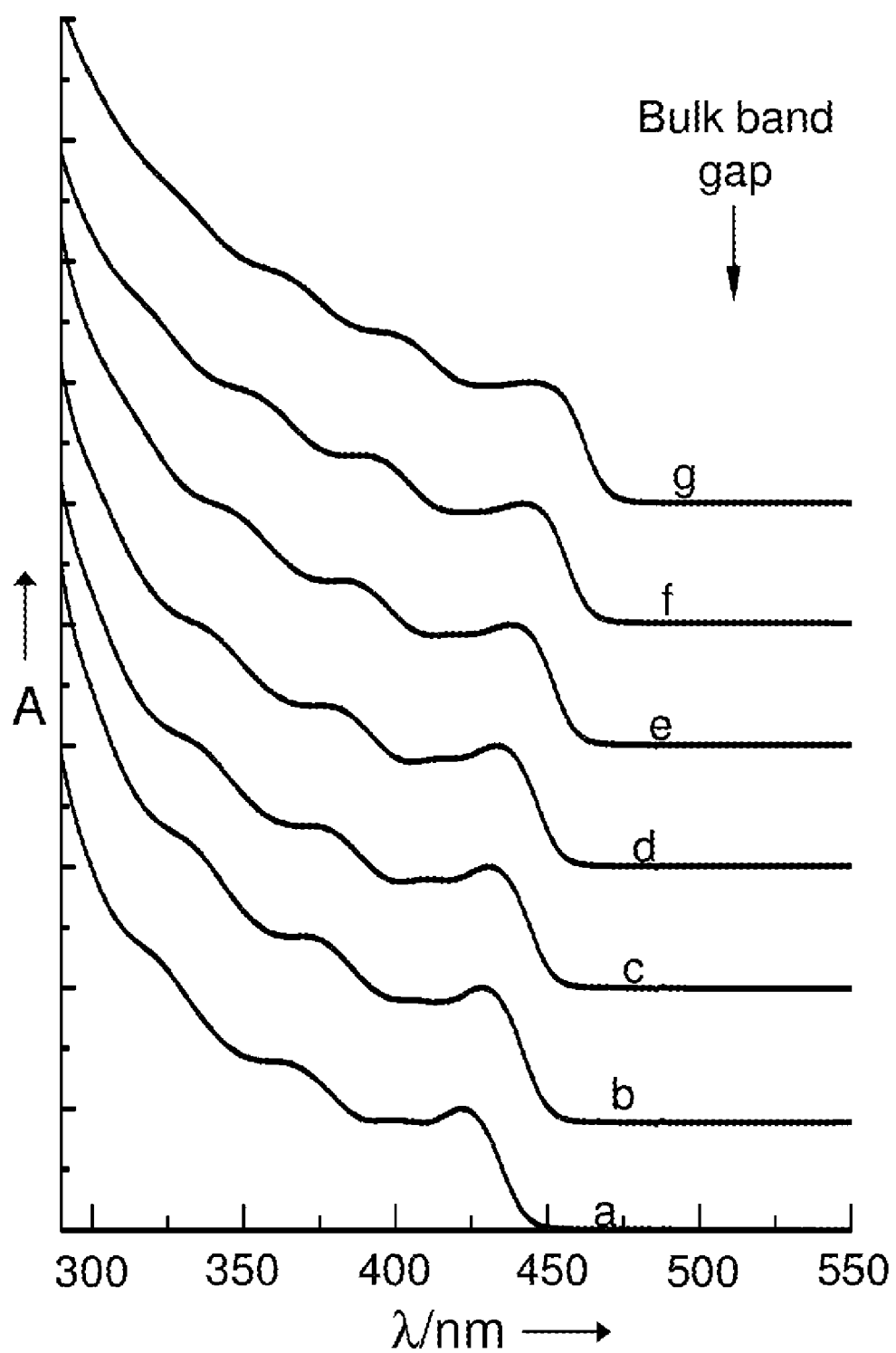
FIGS. 1a-1g are graphs depicting absorption spectra of semiconductor nanocrystals.

Semiconductor nanocrystals with narrow size distributions and high luminescent efficiencies are an attractive alternative to organic molecules in applications such as optoelectronic devices and biological fluorescence labeling. See, for example, V. L. Colvin, et al., Nature 1994, 370, 354; B. O. Dabbousi, et al., Appl. Phys. Lett. 1995, 66, 1316; M. Bruchez Jr., et al., Science 1998, 281, 2013; W. C. W. Chan, and S, Nie, Science 1998, 281, 2016; and H. Mattoussi, et al., J. Am. Chem. Soc. 2000, 122, 12142, each of which is incorporated by reference in its entirety. Semiconductor nanocrystals can be more stable to photo-oxidation and have a more saturated fluorescence (i.e., narrower emission bandwidths) compared to organic molecules. Their size-tunable optical properties, which are independent of their chemical properties, along with their stability and saturated color emission, have made them particularly interesting as the active materials in large area ($cm^2$) hybrid organic/inorganic semiconductor nanocrystal light emitting devices (LEDs). See, for example, S. Coe, et al., Nature 2002, 420, 800; N. Tessler, et al., Science 2002, 295, 1506; and J. S. Steckel, et al., Adv. Mater 2003, 15, 1862, each of which is incorporated by reference in its entirety. Efficient red and green emitting semiconductor nanocrystal LEDs have been realized with (CdSe)ZnS core-shell nanocrystals. The ideal blue emission spectrum of an LED for a flat panel display application would have a narrow bandwidth and a wavelength such that its coordinates on the Commission International d'Eclairage (CIE) Chromaticity Diagram would lie to the outside of the current National Television System Committee (NTSC) standard color triangle. For a Gaussian emission spectrum with a full width at half maximum (FWHM) of 30 nm and a maximized perceived power, the ideal wavelength of blue emission for display applications is ~470 nm. Wavelengths shorter than 470 nm (bluer) become difficult for the human eye to perceive, while those longer than 470 nm (redder) have coordinates that lie inside the standard NTSC color triangle.

Emission wavelengths of CdSe semiconductor nanocrystals span the visible region of the spectrum. Blue emission can be obtained from CdSe particles smaller than 2 nm, which can be difficult to synthesize with a narrow size distribution and good quantum efficiency. CdSe particles of this size can be difficult to process, manipulate, and overcoat with a higher band gap inorganic semiconductor, properties which are desirable for incorporation into solid-state structures. A core-shell type semiconductor nanocrystal can be desirable in a solid state device, such as an LED, due to their enhanced photoluminescence and electroluminescence quantum efficiencies, and greater tolerance to processing conditions necessary for device fabrication. See, for example, S. Coe-Sullivan, et al., Org. Electron. 2003, 4, 123; M. A. Hines, and P. Guyot-Sionnest, J. Phys. Chem. 1996, 100, 468; and B. O. Dabbousi, et al., J. Phys. Chem. B 1997, 101, 9463, and U.S. Pat. No. 6,322,901, each of which is incorporated by reference in its entirety. In addition, semiconductor nanocrystals having a diameter less than 2 nm can have a small absorption cross-section, which leads to a small Förster energy transfer radius.

Large, high-quality ZnSe nanocrystals can exhibit band-edge fluorescence at wavelengths as long as 440 nm. ZnSe has a room temperature bulk band gap of 2.7 eV, corresponding to 460 nm. See M. A. Hines, and P. Guyot-Sionnest, J. Phys. Chem. B 1998, 102, 3655, which is incorporated by reference in its entirety. Both ZnTe and CdS have band gaps appropriate for forming nanocrystals that emit light near 470 nm. ZnTe and CdS have band gaps of 2.39 eV (519 nm) and 2.42 eV (512 nm), respectively. It can be difficult to grow sufficiently large (greater than 4.5 nm diameter) particles of ZnTe with narrow size distributions. Bare CdS cores can emit deep-trap white luminescence that overwhelms the blue emission. See W. W. Yu, and X. Peng, Angew. Chem. Int. Ed. 2002, 41, 2368, which is incorporated by reference in its entirety. Deep-trap luminescence can result from exciton recombination at a deep-trap site in the nanocrystal. Overcoating a nanocrystal can reduce the number of deep-trap sites and thereby reduce the intensity of deep-trap luminescence. Known methods of overcoating CdS nanocrystals failed to eliminate deep trap emission in the overcoated nanocrystals. Unexpectedly, overcoating CdS nanocrystals in the presence of an amine results in overcoated CdS nanocrystals that exhibit bright blue luminescence without deep trap emission.

The method of manufacturing a nanocrystal is a colloidal growth process. See, for example, U.S. Pat. Nos. 6,322,901 and 6,576,291, each of which is incorporated by reference in its entirety. Colloidal growth occurs by rapidly injecting an M-containing compound and an X donor into a hot coordinating solvent. The coordinating solvent can include an amine. The M-containing compound can be a metal, an M-containing salt, or an M-containing organometallic compound. The injection produces a nucleus that can be grown in a controlled manner to form a nanocrystal. The reaction mixture can be gently heated to grow and anneal the nanocrystal. Both the average size and the size distribution of the nanocrystals in a sample are dependent on the growth temperature. The growth temperature necessary to maintain steady growth increases with increasing average crystal size. The nanocrystal is a member of a population of nanocrystals. As a result of the discrete nucleation and controlled growth, the population of nanocrystals obtained has a narrow, monodisperse distribution of diameters. The monodisperse distribution of diameters can also be referred to as a size. The process of controlled growth and annealing of the nanocrystals in the coordinating solvent that follows nucleation can also result in uniform surface derivatization and regular core structures. As the size distribution sharpens, the temperature can be raised to maintain steady growth. By adding more M-containing compound or X donor, the growth period can be shortened.

The M-containing salt is a non-organometallic compound, e.g., a compound free of metal-carbon bonds. M is cadmium, zinc, magnesium, mercury, aluminum, gallium, indium or thallium. The M-containing salt can be a metal halide, metal carboxylate, metal carbonate, metal hydroxide, metal oxide, or metal diketonate, such as a metal acetylacetonate. The M-containing salt is less expensive and safer to use than organometallic compounds, such as metal alkyls. For example, the M-containing salts are stable in air, whereas metal alkyls a generally unstable in air. M-containing salts such as 2,4-pentanedionate (i.e., acetylacetonate (acac)), halide, carboxylate, hydroxide, or carbonate salts are stable in air and allow nanocrystals to be manufactured under less rigorous conditions than corresponding metal alkyls.

Suitable M-containing salts include cadmium acetylacetonate, cadmium iodide, cadmium bromide, cadmium hydroxide, cadmium carbonate, cadmium acetate, cadmium oxide, zinc acetylacetonate, zinc iodide, zinc bromide, zinc hydroxide, zinc carbonate, zinc acetate, zinc oxide, magnesium acetylacetonate, magnesium iodide, magnesium bromide, magnesium hydroxide, magnesium carbonate, magnesium acetate, magnesium oxide, mercury acetylacetonate, mercury iodide, mercury bromide, mercury hydroxide, mercury carbonate, mercury acetate, aluminum acetyl acetonate, aluminum iodide, aluminum bromide, aluminum hydroxide, aluminum carbonate, aluminum acetate, gallium acetylacetonate, gallium iodide, gallium bromide, gallium hydroxide, gallium carbonate, gallium acetate, indium acetylacetonate, indium iodide, indium bromide, indium hydroxide, indium carbonate, indium acetate, thallium acetylacetonate, thallium iodide, thallium bromide, thallium hydroxide, thallium carbonate, or thallium acetate.

Alkyl is a branched or unbranched saturated hydrocarbon group of 1 to 100 carbon atoms, preferably 1 to 30 carbon atoms, such as methyl, ethyl, n-propyl, isopropyl, n-butyl, isobutyl, t-butyl, octyl, decyl, tetradecyl, hexadecyl, eicosyl, tetracosyl and the like, as well as cycloalkyl groups such as cyclopentyl, cyclohexyl and the like. Optionally, an alkyl can contain 1 to 6 linkages selected from the group consisting of —O—, —S—, -M- and —NR— where R is hydrogen, or $C_1$-$C_8$ alkyl or lower alkenyl.

Prior to combining the M-containing salt with the X donor, the M-containing salt can be contacted with a coordinating solvent form an M-containing precursor. Typical coordinating solvents include alkyl phosphines, alkyl phosphine oxides, alkyl phosphonic acids, or alkyl phosphinic acids, however, other coordinating solvents, such as pyridines, furans, and amines may also be suitable for the nanocrystal production. Examples of suitable coordinating solvents include pyridine, tri-n-octyl phosphine (TOP) and tri-n-octyl phosphine oxide (TOPO). Technical grade TOPO can be used. The coordinating solvent can include a 1,2-diol or an aldehyde. The 1,2-diol or aldehyde can facilitate reaction between the M-containing salt and the X donor and improve the growth process and the quality of the nanocrystal obtained in the process. The 1,2-diol or aldehyde can be a $C_6$-$C_{20}$ 1,2-diol or a $C_6$-$C_{20}$ aldehyde. A suitable 1,2-diol is 1,2-hexadecanediol and a suitable aldehyde is dodecanal.

The X donor is a compound capable of reacting with the M-containing salt to form a material with the general formula MX. Typically, the X donor is a chalcogenide donor or a pnictide donor, such as a phosphine chalcogenide, a bis(silyl) chalcogenide, dioxygen, an ammonium salt, or a tris(silyl) pnictide. Suitable X donors include dioxygen, elemental sulfur, bis(trimethylsilyl) selenide ($(TMS)_2Se$), trialkyl phosphine selenides such as (tri-n-octylphosphine) selenide (TOPSe) or (tri-n-butylphosphine) selenide (TBPSe), trialkyl phosphine tellurides such as (tri-n-octylphosphine) telluride (TOPTe) or hexapropylphosphorustriamide telluride (HPPTTe), bis(trimethylsilyl)telluride ($(TMS)_2Te$), sulfur, bis(trimethylsilyl)sulfide ($(TMS)_2S$), a trialkyl phosphine sulfide such as (tri-n-octylphosphine) sulfide (TOPS), tris (dimethylamino) arsine, an ammonium salt such as an ammonium halide (e.g., $NH_4Cl$), tris(trimethylsilyl) phosphide ($(TMS)_3P$), tris(trimethylsilyl) arsenide ($(TMS)_3As$), or tris (trimethylsilyl) antimonide ($(TMS)_3Sb$). In certain embodiments, the M donor and the X donor can be moieties within the same molecule.

The nanocrystal manufactured from an M-containing salt grows in a controlled manner when the coordinating solvent includes an amine.

The amine in the coordinating solvent contributes to the quality of the nanocrystal obtained from the M-containing salt and X donor. Preferably, the coordinating solvent is a mixture of the amine and an alkyl phosphine oxide in a mole ratio of, for example 10:90, 30:70, or 50:50. The combined solvent can decrease size dispersion and can improve photoluminescence quantum yield of the nanocrystal. The preferred amine is a primary alkyl amine or a primary alkenyl amine, such as a $C_2$-$C_{20}$ alkyl amine, a $C_2$-$C_{20}$ alkenyl amine, preferably a $C_8$-$C_{18}$ alkyl amine or a $C_8$-$C_{18}$ alkenyl amine. For example, suitable amines for combining with tri-octylphosphine oxide (TOPO) include 1-hexadecylamine, or oleylamine. When the 1,2-diol or aldehyde and the amine are used in combination with the M-containing salt to form a population of nanocrystals, the photoluminescence quantum efficiency and the distribution of nanocrystal sizes are improved in comparison to nanocrystals manufactured without the 1,2-diol or aldehyde or the amine.

The nanocrystal can be a member of a population of nanocrystals having a narrow size distribution. The nanocrystal can be a sphere, rod, disk, or other shape. The nanocrystal can include a core of a semiconductor material. The nanocrystal can include a core having the formula MX, where M is cadmium, zinc, magnesium, mercury, aluminum, gallium, indium, thallium, or mixtures thereof, and X is oxygen, sulfur, selenium, tellurium, nitrogen, phosphorus, arsenic, antimony, or mixtures thereof.

The nanocrystal can emit light when excited. The nanocrystal can be excited by irradiation with an excitation wavelength of light, by electrical excitation, or by other energy transfer. The emission from the nanocrystal can be a narrow Gaussian emission band that can be tuned through the complete wavelength range of the ultraviolet, visible, or infrared regions of the spectrum by varying the size of the nanocrystal, the composition of the nanocrystal, or both. For example, both CdSe and CdS can be tuned in the visible region and InAs can be tuned in the infrared region.

A population of nanocrystals can have a narrow size distribution. The population can be monodisperse and can exhibit less than a 15% rms deviation in diameter of the nanocrystals, preferably less than 10%, more preferably less than 5%. Spectral emissions in a narrow range of between 10 and 100 nm full width at half max (FWHM) can be observed. The FWHM, expressed in terms of energy, can be no greater than 0.05 eV, or no greater than 0.03 eV. Semiconductor nanocrystals can have emission quantum efficiencies of greater than 2%, 5%, 10%, 20%, 40%, 60%, 70%, or 80%. The semiconductor forming the core of the nanocrystal can include Group II-VI compounds, Group II-V compounds, Group III-VI compounds, Group III-V compounds, Group IV-VI compounds, Group I-III-VI compounds, Group II-IV-VI compounds, and Group II-IV-V compounds, for example, ZnS, ZnSe, ZnTe, CdS, CdSe, CdTe, HgS, HgSe, HgTe, AlN, AlP, AlAs, AlSb, GaN, GaP, GaAs, GaSb, GaSe, InN, InP, InAs, InSb, TlN, TlP, TlAs, TlSb, PbS, PbSe, PbTe, or mixtures thereof.

The quantum efficiency of emission from nanocrystals having a core of a first semiconductor material be enhanced by applying an overcoating of a second semiconductor material such that the conduction band of the second semiconductor material is of higher energy than that of the first semiconductor material, and the valence band of the second semiconductor material is of lower energy than that of the first semiconductor material. As a result, carriers, i.e., electrons and holes, are confined in the core of the nanocrystal. The core can have an overcoating on a surface of the core. The overcoating can be a semiconductor material having a composition different from the composition of the core, and can have a band gap greater than the band gap of the core. The overcoat of a semiconductor material on a surface of the nanocrystal can include a Group II-VI compounds, Group II-V compounds, Group III-VI compounds, Group III-V compounds, Group IV-VI compounds, Group I-III-VI compounds, Group II-IV-VI compounds, and Group II-IV-V compounds, for example, ZnS, ZnSe, ZnTe, CdS, CdSe, CdTe, HgS, HgSe, HgTe, MN, AlP, AlAs, AlSb, GaN, GaP, GaAs, GaSb, GaSe, InN, InP, InAs, InSb, TlN, TlP, TlAs, TlSb, PbS, PbSe, PbTe, or mixtures thereof.

The outer surface of the nanocrystal can include a layer of compounds derived from the coordinating agent used during the growth process. The surface can be modified by repeated exposure to an excess of a competing coordinating group to form an overlayer. For example, a dispersion of the capped nanocrystal can be treated with a coordinating organic compound, such as pyridine, to produce crystals which disperse readily in pyridine, methanol, and aromatics but no longer disperse in aliphatic solvents. Such a surface exchange process can be carried out with any compound capable of coordinating to or bonding with the outer surface of the nanocrystal, including, for example, phosphines, thiols, amines and phosphates. The nanocrystal can be exposed to short chain polymers which exhibit an affinity for the surface and which terminate in a moiety having an affinity for a suspension or dispersion medium. Such affinity improves the stability of the suspension and discourages flocculation of the nanocrystal.

Monodentate alkyl phosphines (and phosphine oxides, the term phosphine below will refer to both) can passivate nanocrystals efficiently. When nanocrystals with conventional monodentate ligands are diluted or embedded in a non-passivating environment (i.e. one where no excess ligands are present), they tend to lose their high luminescence and their initial chemical inertness. Typical are an abrupt decay of luminescence, aggregation, and/or phase separation. In order to overcome these limitations, polydentate ligands can be used, such as a family of polydentate oligomerized phosphine ligands. The polydentate ligands show a high affinity between ligand and nanocrystal surface. In other words, they are stronger ligands, as is expected from the chelate effect of their polydentate characteristics.

Oligomeric phosphines have more than one binding site to the nanocrystal surface, which ensures their high affinity to the nanocrystal surface. See, for example, for example, U.S. Ser. No. 10/641,292, filed Aug. 15, 2003, and U.S. Ser. No. 60/403,367, filed Aug. 15, 2002, each of which is incorporated by reference in its entirety. The oligomeric phosphine can be formed from a monomeric, polyfunctional phosphine, such as, for example, trishydroxypropylphosphine, and a polyfunctional oligomerization reagent, such as, for example, a diisocyanate. The oligomeric phosphine can be contacted with an isocyanate of formula R'-L-NCO, wherein L is $C_2$-$C_{24}$ alkylene, and R' has the formula

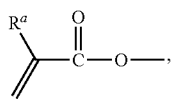

R' has the formula

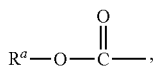

or R' is hydrogen, wherein $R^a$ is hydrogen or $C_1$-$C_4$ alkyl.

An overcoating process is described, for example, in U.S. Pat. No. 6,322,901, incorporated herein by reference in its entirety. By adjusting the temperature of the reaction mixture during overcoating and monitoring the absorption spectrum of the core, over coated materials having high emission quantum efficiencies and narrow size distributions can be obtained. Alternatively, an overcoating can be formed by exposing a core nanocrystal having a first composition and first average diameter to a population of nanocrystals having a second composition and a second average diameter smaller than the first average diameter.

Size distribution during the growth stage of the reaction can be estimated by monitoring the absorption line widths of the particles. Modification of the reaction temperature in response to changes in the absorption spectrum of the particles allows the maintenance of a sharp particle size distribution during growth. Reactants can be added to the nucleation solution during crystal growth to grow larger crystals. By stopping growth at a particular nanocrystal average diameter, a population having an average nanocrystal diameter of less than 150 Å can be obtained. A population of nanocrystals can have an average diameter of 15 Å to 125 Å.

The particle size distribution can be further refined by size selective precipitation with a poor solvent for the nanocrystals, such as methanol/butanol as described in U.S. Pat. No. 6,322,901, incorporated herein by reference in its entirety. For example, nanocrystals can be dispersed in a solution of 10% butanol in hexane. Methanol can be added dropwise to this stirring solution until opalescence persists. Separation of supernatant and flocculate by centrifugation produces a precipitate enriched with the largest crystals in the sample. This procedure can be repeated until no further sharpening of the optical absorption spectrum is noted. Size-selective precipitation can be carried out in a variety of solvent/nonsolvent pairs, including pyridine/hexane and chloroform/methanol. The size-selected nanocrystal population can have no more than a 15% rms deviation from mean diameter, preferably 10% rms deviation or less, and more preferably 5% rms deviation or less.

Transmission electron microscopy (TEM) can provide information about the size, shape, and distribution of the nanocrystal population. Powder X-ray diffraction (XRD) patterns can provided the most complete information regarding the type and quality of the crystal structure of the nanocrystals. Estimates of size are also possible since particle diameter is inversely related, via the X-ray coherence length, to the peak width. For example, the diameter of the nanocrystal can be measured directly by transmission electron microscopy or estimated from X-ray diffraction data using, for example, the Scherrer equation. It also can be estimated from the UV/Vis absorption spectrum.

EXAMPLES

A two-step synthetic route was employed to prepare (CdS) ZnS core-shell nanocrystals. In the first step, the CdS cores were prepared by rapidly injecting the precursor solution into a round bottom flask containing degassed (under vacuum at 100° C. for 1 hour) oleylamine (7 mL, 98% Pfaltz & Bauer Inc.) and trioctyiphosphine (TOP) (8 mL, 97% Strem) stirring rapidly at 250-280° C. and then growing at 250° C. for 15 to 30 minutes. See, for example, B. K. H. Yen, et al., *Adv. Mater* 2003, 15, 1858, which is incorporated by reference in its entirety. The precursor solution was made by mixing a degassed (under vacuum at 100° C. for 1 hour) mixture of cadmium acetate hydrate (1-2 mmol), TOP (6 mL), and 1-2 mmol of bis(2,4,4-trimethylpentyl) phosphinic acid (BT-MPPA, sold as Cyanex⁺ 272 Extractant, Cytec Canada Inc., see published U.S. Patent Application 2002/0144644, which is incorporated by reference in its entirety) with a degassed (under vacuum at room temperature for 1 hour) solution of elemental sulfur (1-2 mmol) in oleylamine (3 mL). The size was tuned by changing the injection temperature, growth time, and concentration of precursors, while maintaining the sulfur to cadmium to BTMPPA ratio at 1:1:1.

Before overcoating, the CdS cores were precipitated out of growth solution and then one more time out of hexane to remove unreacted precursors and excess capping ligands. The particles were flocculated from growth solution by adding 0.4 volumes of hexane, 0.8 volumes of butanol, and 3.0 volumes of methanol to 1.0 volume of growth solution and centrifuging for 5 minutes. The particles were then dispersed in 0.15 volumes of hexane and flocculated by adding 1 drop of butanol per 1 volume of original growth solution and 0.5 volumes of methanol and centrifuging for 5 minutes.

FIG. 1 shows the optical absorption spectra for a size series of CdS nanocrystals, demonstrating their narrow size distributions. The CdS nanocrystals ranged in size from 3.7±0.4 nm to 5.2±0.4 nm in diameter. The longest wavelength absorption feature for spectrum (a) occurs at $\lambda$=422 nm, (b) 427 nm, (c) 432 nm, (d) 435 nm, (e) 439 nm, (f) 444 nm, and (g) 448 nm. The largest particles with a first absorption feature at 448 nm (core diameter 5.2±0.4 nm) still exhibit secondary and even tertiary absorption features.

Figure 2:
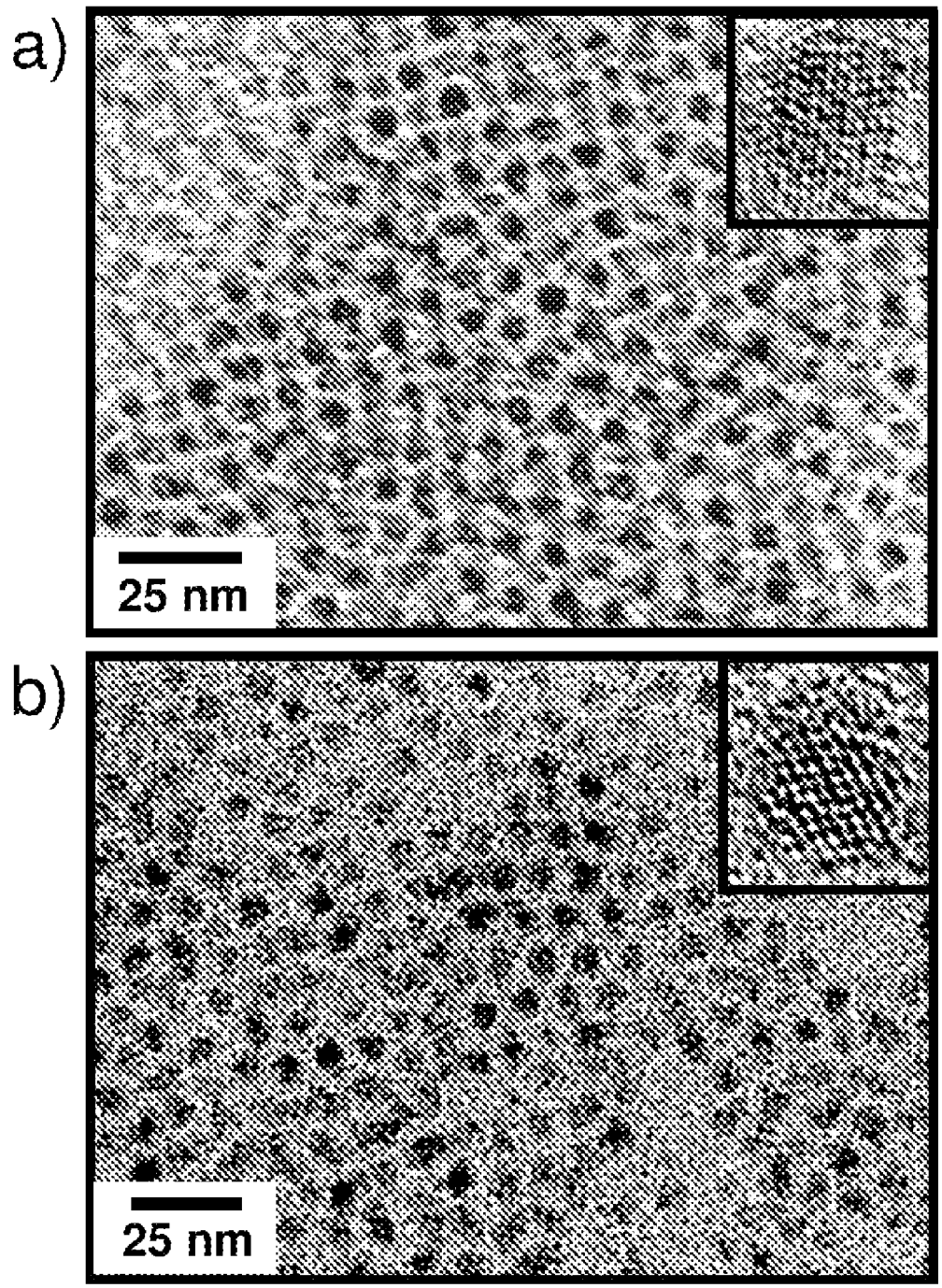
FIGS. 2a and 2b are TEM images of semiconductor nanocrystals.

FIG. 2a presents TEM images of bare CdS nanocrystals with a diameter of 4.9±0.4 nm. The crystallinity of the core material is seen clearly in the inset of FIG. 2a, in which the HRTEM micrograph shows the atom columns of a ~4.9 nm particle. The low resolution TEM image (FIG. 2a) illustrates the relatively good size-distribution and morphology of the particles.

Figure 3:
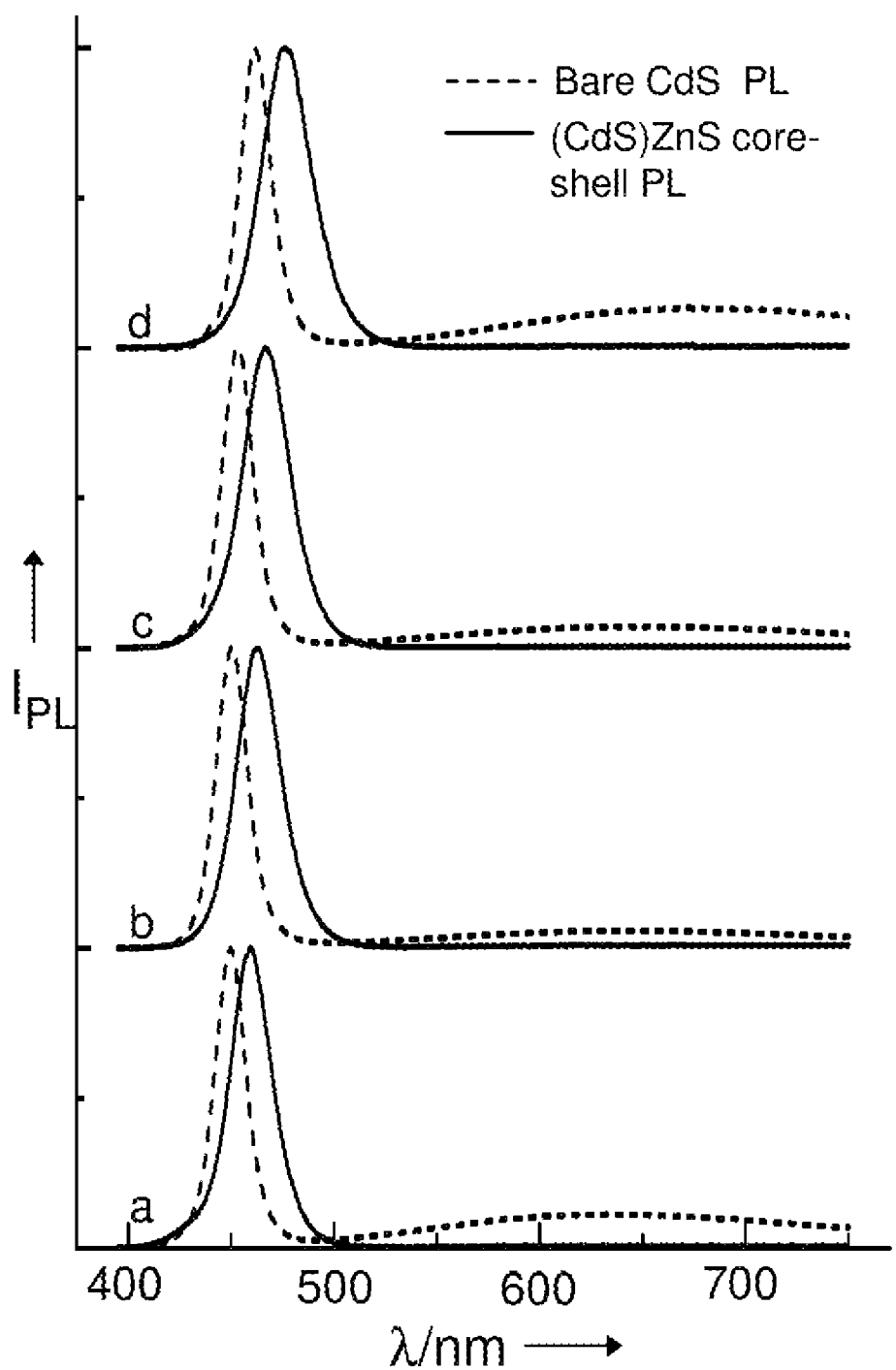
FIGS. 3a-3d are graphs depicting photoluminescence spectra of semiconductor nanocrystals.

Photoluminescence quantum efficiencies for these CdS nanocrystals after processing were 3-6%. The photoluminescence of the CdS core nanocrystals contains a noticeable quantity of deep trap emission, giving the core materials a violet appearance when excited with a UV lamp. Dashed lines in FIG. 3 are normalized photoluminescence spectra of bare CdS nanocrystals. In FIG. 3, deep trap emission is seen as a broad feature having longer wavelengths than the peak emission.

Growth of the ZnS shell was based on the prior overcoating procedure for (CdSe)ZnS core-shell nanocrystals. See, for example, M. A. Hines, and P. Guyot-Sionnest, *J. Phys. Chem.* 1996, 100, 468; B. O. Dabbousi, et al., *J. Phys. Chem. B* 1997, 101, 9463; and U.S. Pat. No. 6,207,229, each of which is incorporated by reference in its entirety. ZnS was chosen as the shell material because of its large band gap (3.7 eV corresponding to $\lambda$=335 nm), which aids confinement of the exciton on the CdS core, accompanied by the relatively small, 8% lattice mismatch between CdS and ZnS. Trioctylphosphine oxide (TOPO) (8-14 g, 99% Strem), oleylamine (3 mL), hexadecylamine (2 g, 98% Aldrich), and BTMPPA (0.3-2.0 mmol) were degassed under vacuum for 2 hours in a four-necked flask at 100° C. The CdS cores dispersed in hexane were then added to the degassed solution and the hexane was pulled off at 80° C. under vacuum. Under a flow of argon, the nanocrystal solution was heated to 180° C. and the ZnS shell precursor solution (diethyl zinc (min. 95% Strem) and hexamethyldisilthiane (>97% Fluka) dissolved in TOP (7 mL)) was introduced into the flask by dropwise addition (~0.1 drop/2 seconds). After addition was complete the solution was kept at 180° C. for 5 minutes and then left stirring overnight at 75° C. to promote annealing of the shell. The (CdS)ZnS core-shell nanocrystals were obtained by precipitation using a mixture of butanol and methanol, similar to the core processing procedure.

As the zinc and sulfur precursors were added, the weak violet fluorescence changed gradually over the course of the overcoating process to a bright blue emission. FIG. 3 shows the emission spectra of CdS cores before overcoating (dashed lines) and the corresponding (CdS)ZnS core-shell emission spectrum after overcoating (solid lines). The spectra in FIG. 3 were recorded for: (a) CdS nanocrystals emitting at 450 nm (4.7±0.4 nm diameter core, FWHM=18 nm) and overcoated with ~2 monolayers emitting at 460 nm (FWHM=24 nm), (b) bare CdS nanocrystals emitting at 450 nm (4.7±0.4 nm diameter core, FWHM=18 nm) and overcoated with ~3 monolayers emitting at 465 nm (FWHM=25 nm), (c) bare CdS nanocrystals emitting at 454 nm (4.9±0.4 nm diameter core, FWHM=18 nm) and overcoated with ~3 monolayers emitting at 469 nm (FWHM=27 nm), and (d) bare CdS nanocrystals emitting at 463 nm (5.2±0.4 nm diameter core, FWHM=18 nm) and overcoated with ~4.5 monolayers emitting at 480 nm (FWHM=28 nm).

Figure 8:
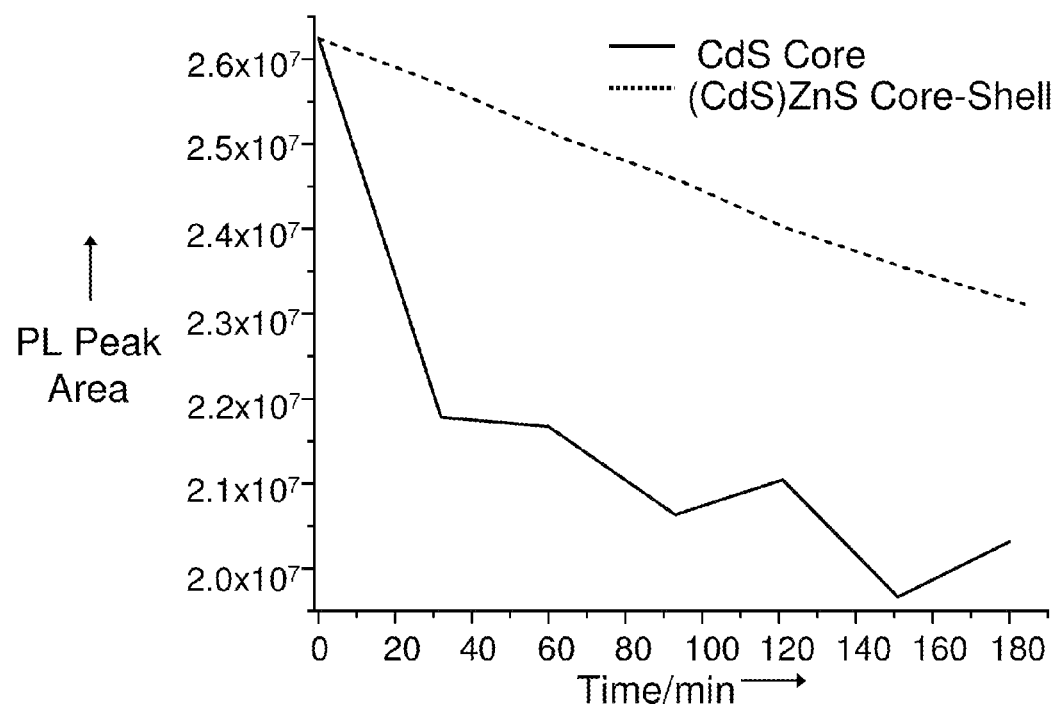
FIG. 8 is a graph depicting photoluminescence stability of semiconductor nanocrystals.

Overcoating CdS cores with a ZnS shell increased the photoluminescence stability. Photoluminescence stability was measured for both core and core-shell nanocrystals that were precipitated out of solution two times and drop-cast from hexane onto a glass slide. Each slide sat in open air for a total of 180 minutes and a scan was acquired every 30 minutes. See FIG. 8, which shows photoluminescence intensity as a function of time. The core-shell nanocrystals exhibit photoluminescence quantum efficiencies of 20-30%. Photoluminescence quantum efficiencies were determined by comparing the integrated emission of a given nanocrystal sample in dilute hexane solution having an optical density of 0.1 with that of Coumarin 102 (Lambda Physik) in ethanol. The quantum efficiency peaks at an average ZnS shell thickness of ~3 monolayers (3.1 Å per monolayer).

Addition of amine to bare CdS cores did not alter the deep trap emission from the cores. When the overcoating was prepared in the absence of amine, the resulting (CdS)ZnS nanocrystals still exhibited some deep trap emission. See D. V. Talapin, et al., *Nano Lett.* 2001, 1, 207, which is incorporated by reference in its entirety. Surprisingly, the presence of amine during overcoating can allow the controlled growth of the ZnS shell, such that the resulting nanocrystals are free of deep trap emission (see FIG. 3). These observations make it difficult to distinguish how the amine independently affects shell thickness (amine concentration was always held constant) and quantum yield. Thicker shells of ZnS on the core CdS nanocrystals are associated with increased emission FWHM. The band-edge emission FWHM of the CdS core particles was 17-19 nm. After overcoating with 2-3 monolayers the FWHM increased to about 24-26 nm, accompanied by red shifts of about 10 nm in emission and about 5 nm for the first absorption feature. FIG. 6 presents absorption spectra of core CdS and core-shell (CdS)ZnS nanocrystals. The spectra were recorded from samples of: (a) bare 4.7±0.4 nm CdS (dotted line) and corresponding (CdS)ZnS core-shell nanocrystals (solid line) with an average ZnS shell thickness of ~2 monolayers; (b) bare 4.9±0.4 nm CdS (dotted line) and corresponding (CdS)ZnS core-shell nanocrystals (solid line) with an average ZnS shell thickness of ~3 monolayers; and (c) bare 5.2±0.4 nm CdS (dotted line) and the corresponding (CdS)ZnS core-shell nanocrystals (solid line) with an average ZnS shell thickness of ~4.5 monolayers. Similar red shifts in absorption have been observed for the overcoating of CdSe with ZnS and are due to the leakage of the exciton into the shell. Wavelength dispersive spectroscopy confirmed the thickness of the ZnS shell for the sample of FIGS. 2b and 5c, giving an average element weight percent of 21.6±0.9% for Cd, 32.2±0.5% for Zn, and 46.2±0.7% for S. These values correspond to a 0.77 nm (2.5 monolayers) thick theoretical ZnS shell, which was consistent with the average experimental thickness obtained from TEM measurements.

Figure 4:
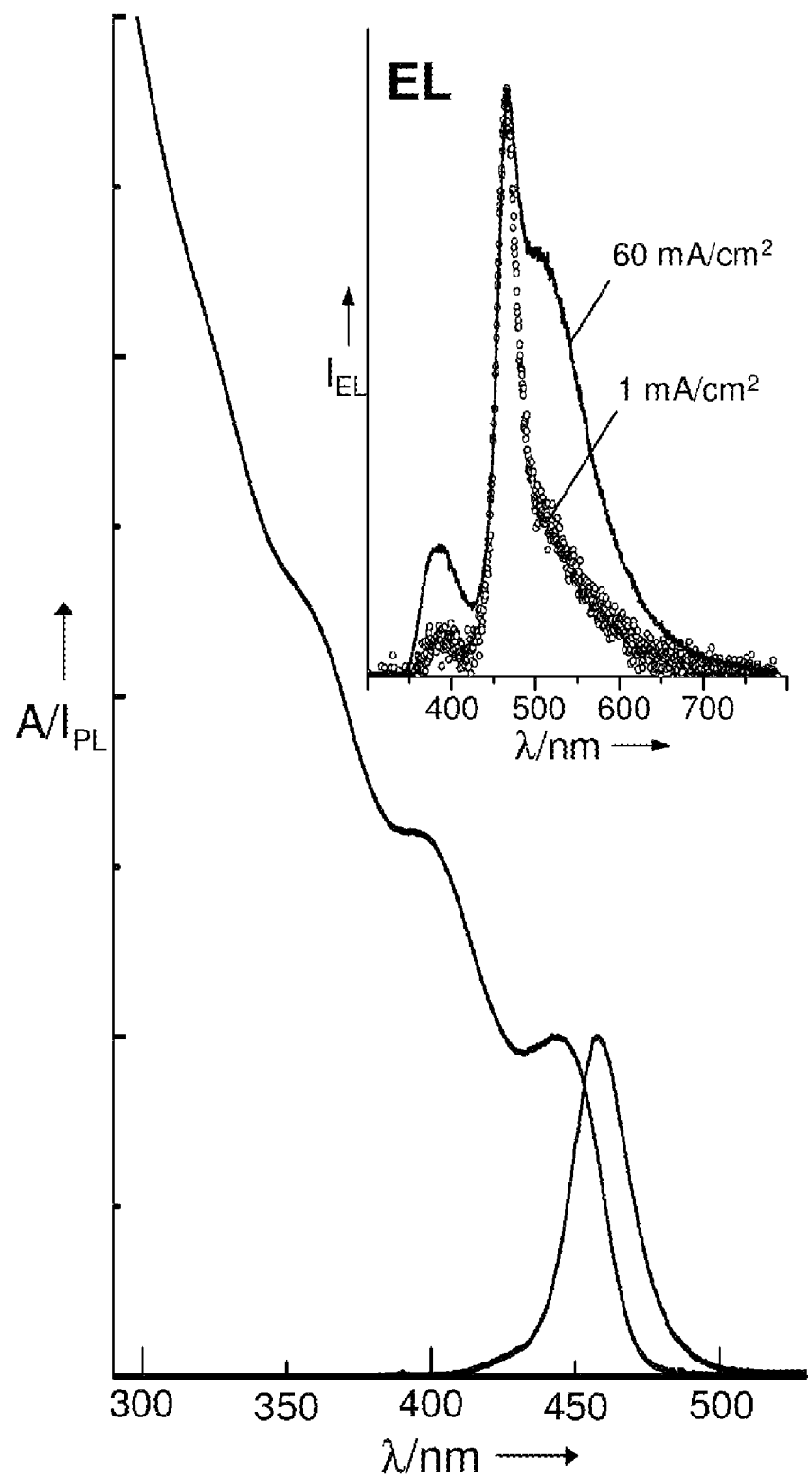
FIG. 4 is a graph depicting absorption and photoluminescence spectra of semiconductor nanocrystals. The inset is a graph depicting electroluminescence spectra of a light-emitting device including semiconductor nanocrystals.

FIG. 4 shows the absorption and emission spectra of 5.4±0.4 nm (CdS)ZnS core-shell nanocrystals. The inset demonstrates (CdS)ZnS core-shell electroluminescence. The layered device (see S. Coe, et al., Nature 2002, 420, 800, which is incorporated by reference in its entirety) has the structure ITO/CBP/(CdS)ZnS nanocrystal monolayer/TAZ/Alq3/Mg:Ag/Ag, and exhibits an external quantum efficiency of 0.1% (see FIG. 7), where CBP is 4,4'-N,N'-dicarbazolyl-biphenyl. At low currents (circles in FIG. 4 inset, 1 mA/cm² at 14 V) the FWHM of the LED spectral peak was 30 nm centered at 468 nm, while at higher currents (solid line in FIG. 4 inset, 60 mA/cm² at 21V) the electroluminescence from organic layers began to dominate. Organic electroluminescence can be seen as the shoulders in the UV and the green regions of the spectrum (see FIG. 4 inset). Organic and nanocrystal luminescence occurred simultaneously in the working device and as more current was applied, the ratio of nanocrystal to organic emission changed (see, for example, S. Coe-Sullivan, et al., Org. Electron. 2003, 4, 123).

Figure 7:
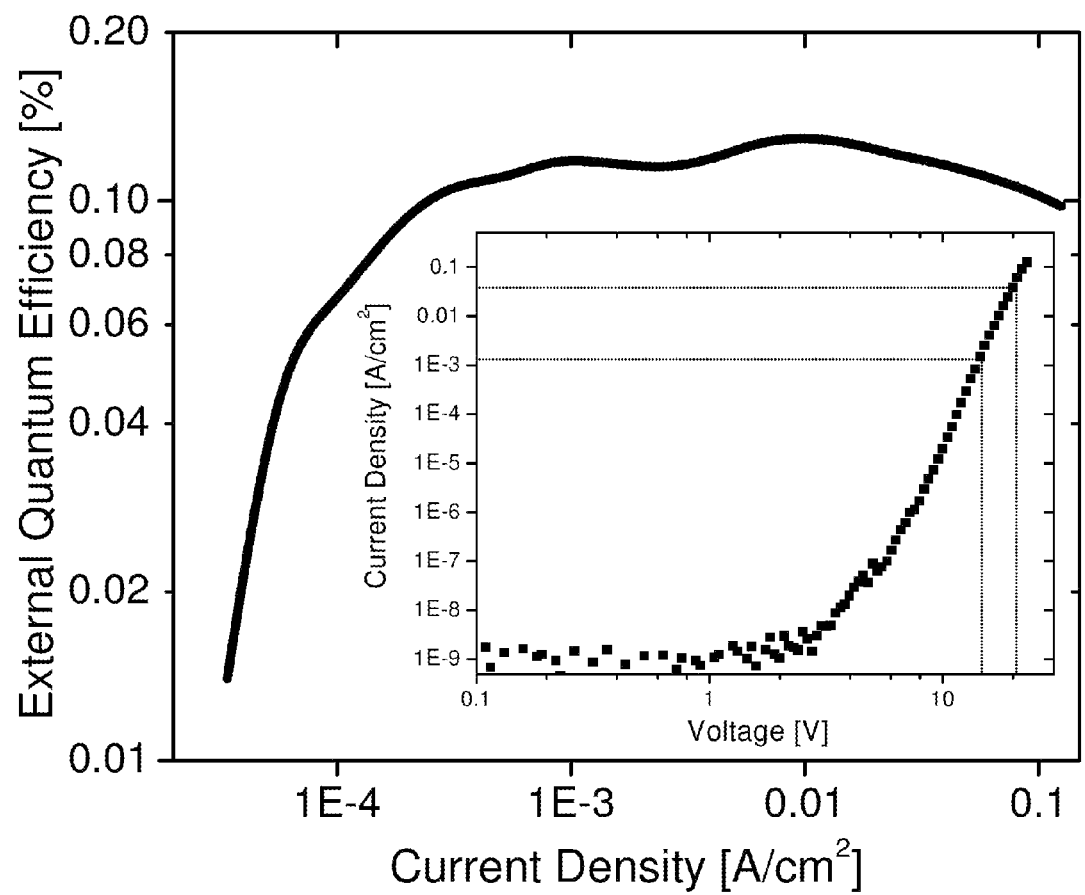
FIG. 7 is a graph depicting performance of a light-emitting device.

FIG. 7 shows the external quantum efficiency versus current density plot for the light emitting device. The inset shows the I-V (current-voltage) curve with two dotted lines indicating the two different current densities (1 mA/cm² at 14 V and 60 mA/cm² at 21 V) to which the electroluminescence spectra in the inset of FIG. 4 correspond.

Figure 5:
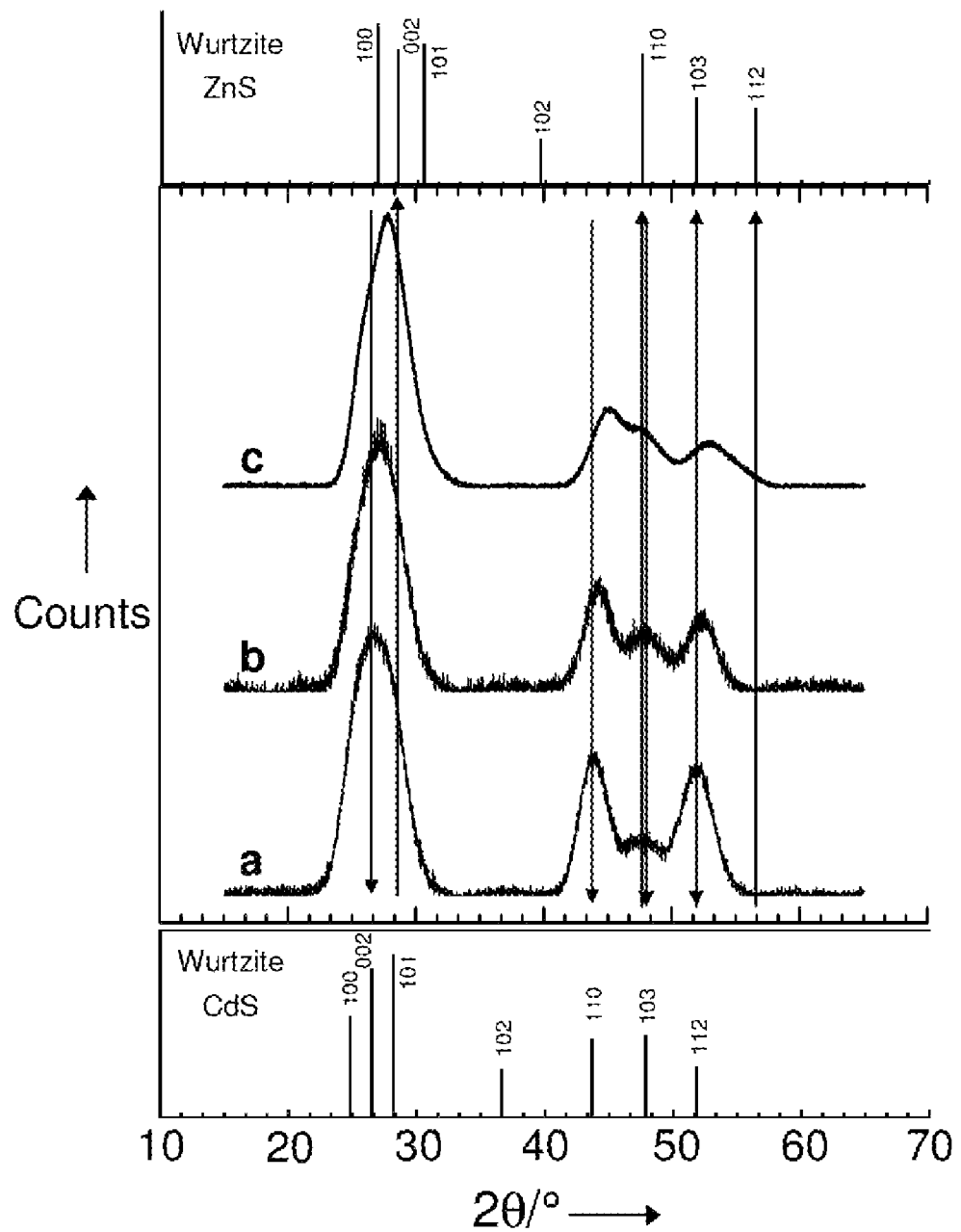
FIGS. 5a-5c are graphs depicting X-ray diffraction patterns of semiconductor nanocrystals.
Figure 6:
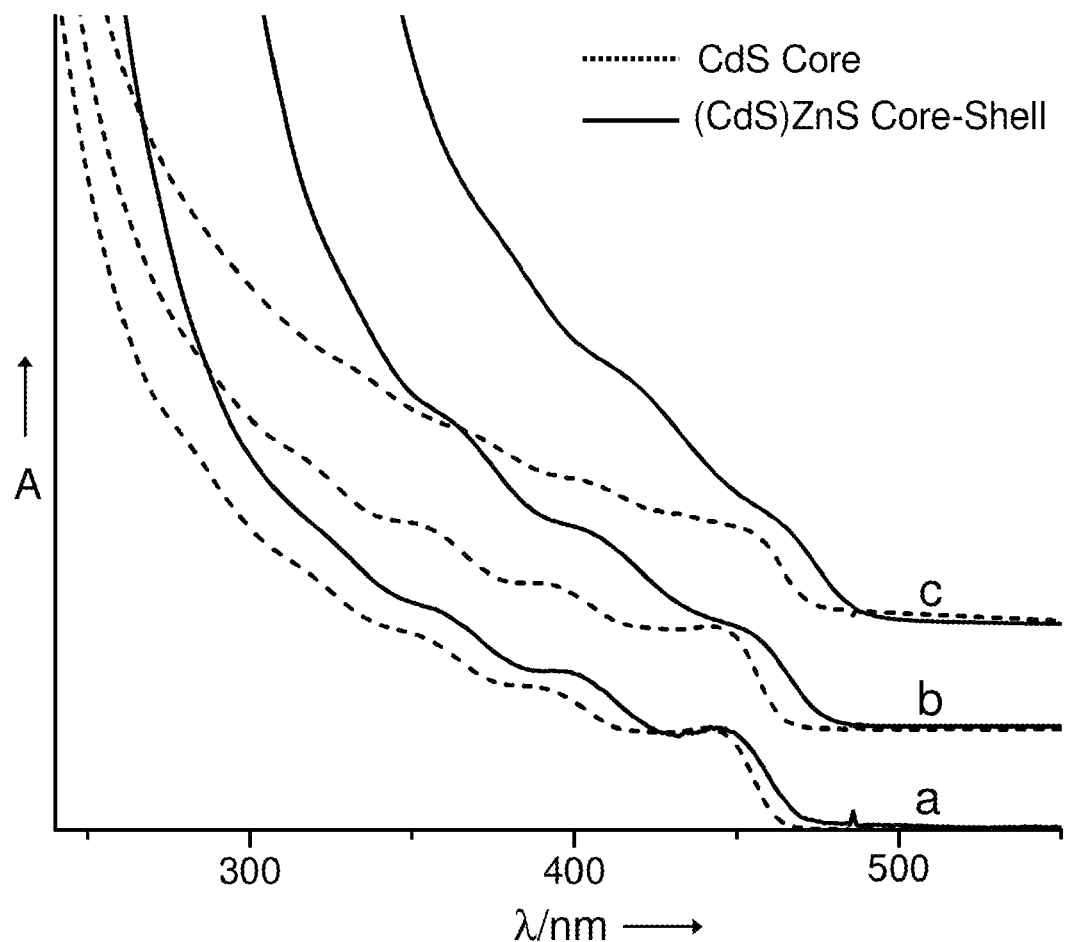
FIGS. 6a-6c are graphs depicting absorption spectra of semiconductor nanocrystals.

FIG. 5a shows the X-ray powder pattern for 4.9±0.4 nm bare CdS nanocrystals, which appeared to be a wurtzite structure with zinc-blende stacking faults along the 002 direction. The X-ray powder patterns of core-shell nanocrystals with ZnS coverages of ~2 monolayers (FIG. 5b) and ~3 monolayers (FIG. 5c) showed a noticeable influence of the wurtzite ZnS shell on the overall diffraction pattern. Little evidence of small ZnS particles was seen with TEM or optical spectroscopy, but nonetheless care was taken during sample preparation to ensure that no ZnS particles were present for the XRD and WDS measurements.

CdS cores were prepared as described above, where the reaction includes 2 mmol of Cd(OAc)₂, 2 mmol BTMPPA, and 2 mmol S, affording 0.23 mmol of CdS cores in a single reaction.

Degassing the mixture of elemental sulfur and oleylamine for a shorter period of time can enhance the monodispersity of CdS cores. A preparation of CdS cores was carried out as above, except that the mixture of elemental sulfur and oleylamine was degassed for 10-15 minutes. As a result, the reaction below was driven less to completion. Therefore, less H₂S (which leaves as a gas) and less $(RHN)_2S_{n-1}$ (which alters the rate of CdS core formation) was produced.

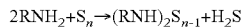

$2RNH_2 + S_n \rightarrow (RNH)_2S_{n-1} + H_2S$

Figure 9A:
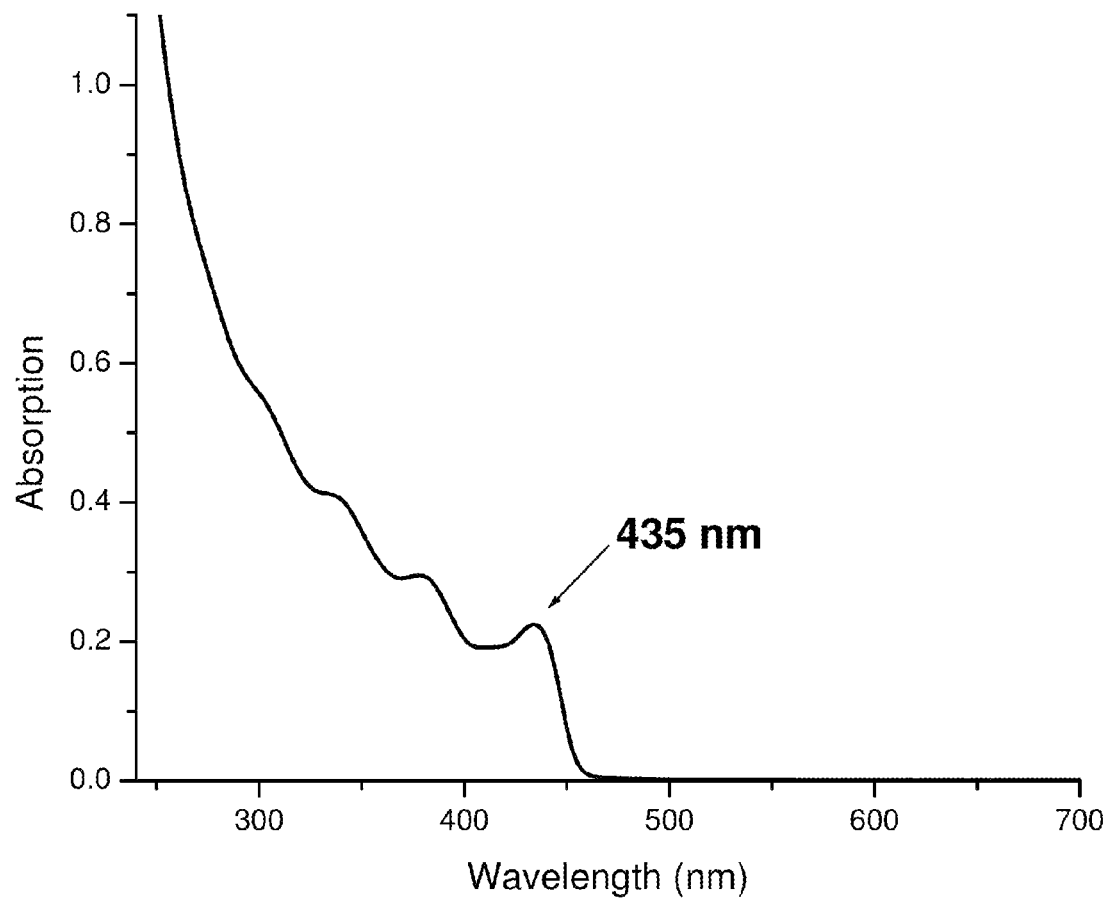
FIGS. 9a-9b are graphs depicting absorption spectra of semiconductor nanocrystals.
Figure 9B:
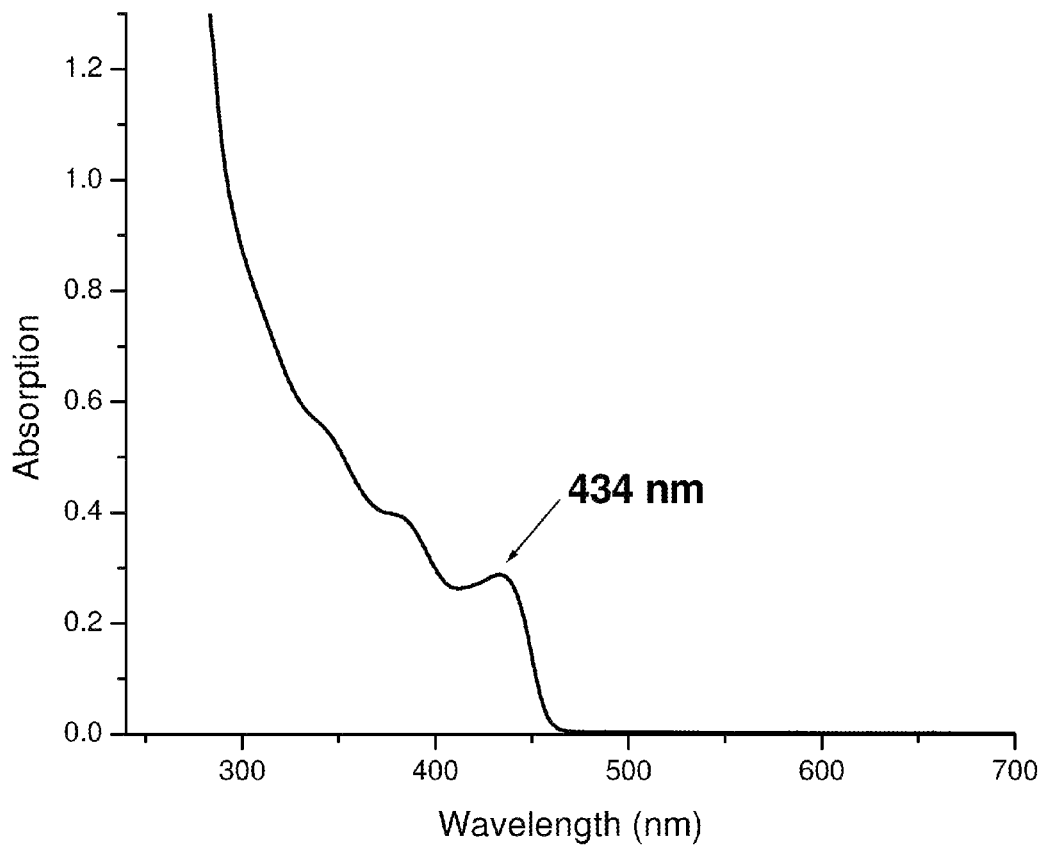

The faster degassing step changed the relative ratio of elemental sulfur $(S_n)$ to $(RHN)_2S_{n-1}$ and produced CdS nanocrystal cores that were more uniform in size (17 nm FWHM compared to 18-20 nm FWHM of emission). CdS cores produced with a shorter sulfur/amine degassing step were more efficient light emitters (3-6% to 15%) at a give with reaction yield. Higher quality (more efficient light emitters, tighter size distributions) core nanocrystals in the end yields higher quality core-shell materials. An absorption spectrum of the nanocrystals is presented in FIG. 9A. The reaction was carried out using 2 mmol each of Cd(OAc)₂, BTMPPA, and S, affording 0.24 mmol of CdS cores having a quantum yield of 16% and a FWHM of 18 nm. An absorption spectrum of the nanocrystals is presented in FIG. 9B.

Figure 10A:
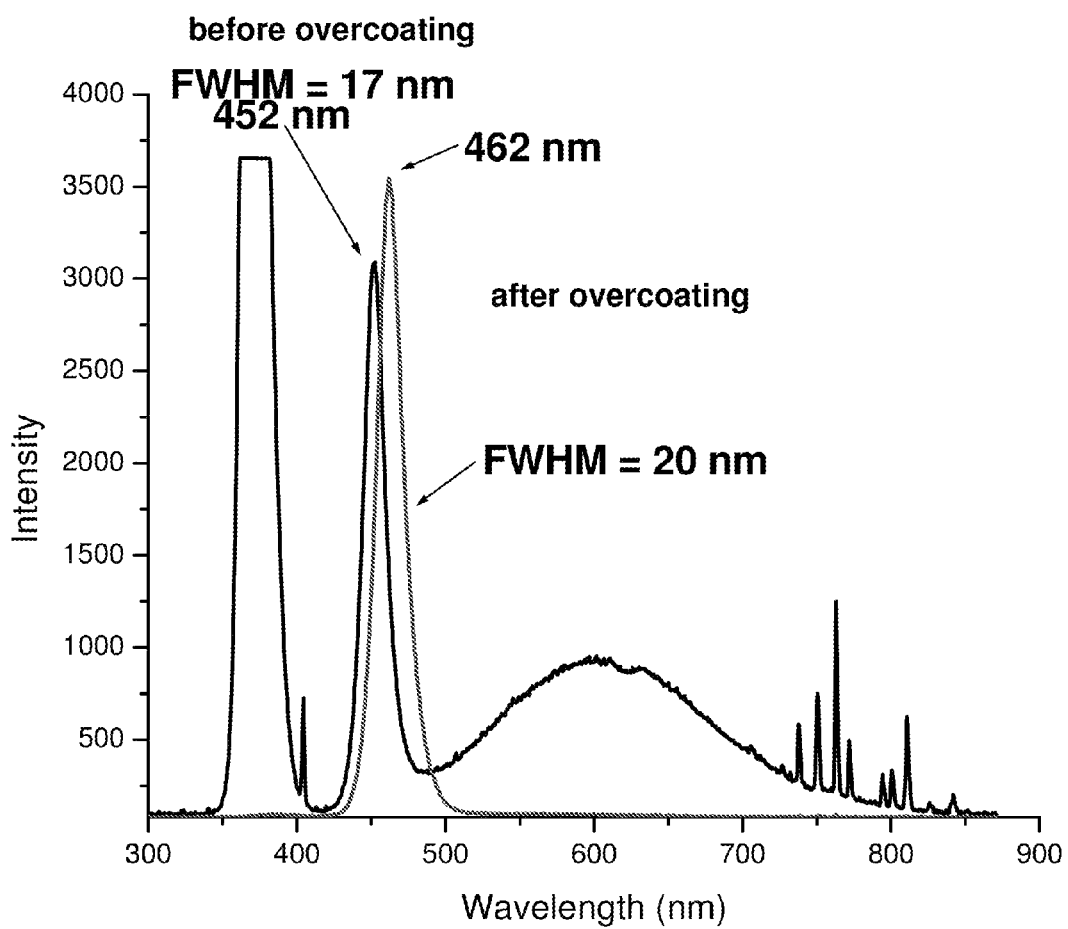
FIGS. 10a-10b are graphs depicting photoluminescence spectra of semiconductor nanocrystals.
Figure 10B:
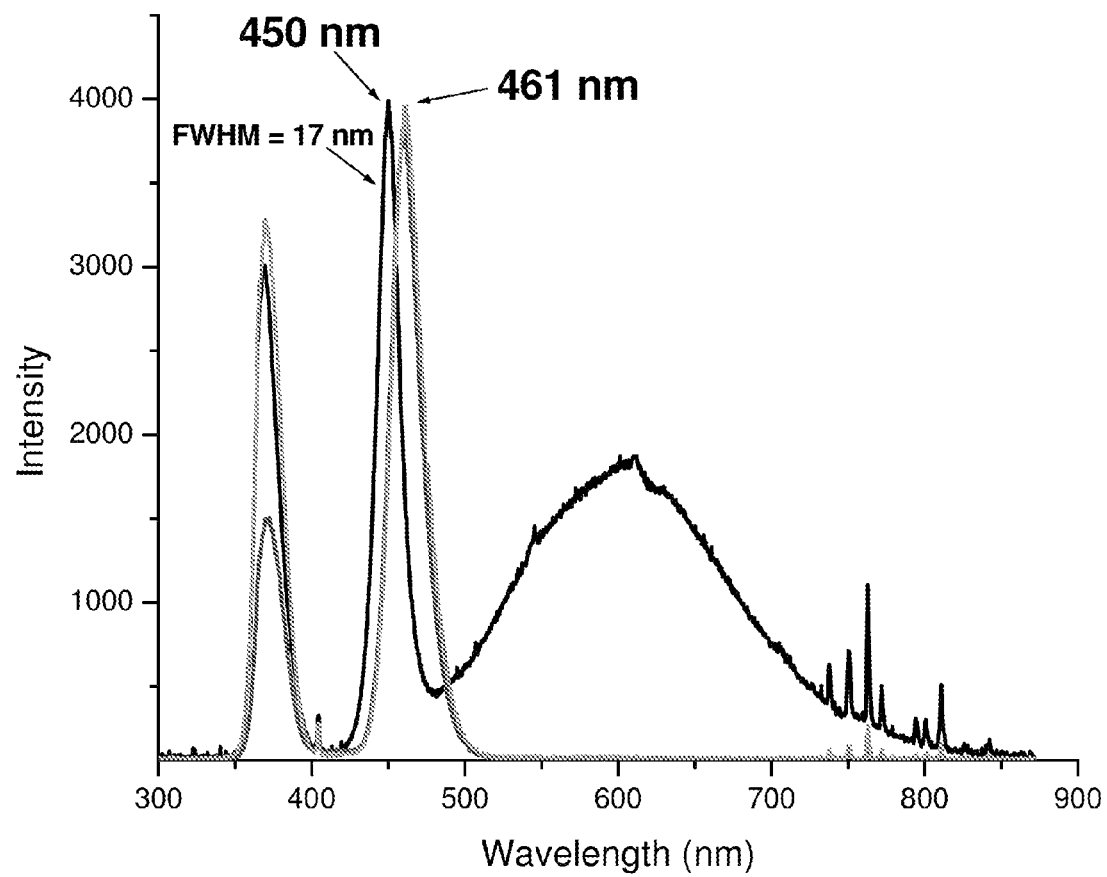

An overcoating reaction was performed by combining CdS cores in a flask with TOPO (6 g), BTMPPA (0.5 mmol), oleylamine (1.5 mL), and HDA (1 g). The contents of the flask were heated to 170° C. and a shell precursor solution added by addition funnel at a rate of approximately 1 drop every 2 seconds. The shell precursor solution included diethyl zinc (17 mg) and a two- to three-fold excess of hexamethyldisilthiane (141 mg), and 10-30% (relative to Zn, on a molar basis) of dimethyl cadmium (4 mg) dissolved in TOP (7 mL)). The resulting overcoated nanocrystals had an emission with a FWHM of 20 nm and a quantum yield of 25%, and greater stability of emission compared to nanocrystals prepared in by an overcoating reaction lacking an excess of sulfur precursor or dimethyl cadmium. These properties can result from doping the ZnS shell slightly with Cd to provide a smoother transition from the CdS core to the ZnS as it was growing. The excess sulfur provided a concentrated sulfur environment when the ZnS shell was growing, providing a smoother and more crystalline shell growth and better interface with less defects between the CdS core and the ZnS shell. Photoluminescence spectra of the cores before overcoating and of the overcoated nanocrystals are presented in FIG. 10A. The same solvent system was used for overcoating CdS cores, but the shell precursor solution was added to the flask continuously via a syringe pump over 2 hours, at a rate of 58 μL/min. The resulting nanocrystals had an emission FWHM of 22 nm and a QY of 43%. Photoluminescence spectra of the cores before overcoating and of the overcoated nanocrystals are presented in FIG. 10B.

Figure 11A:
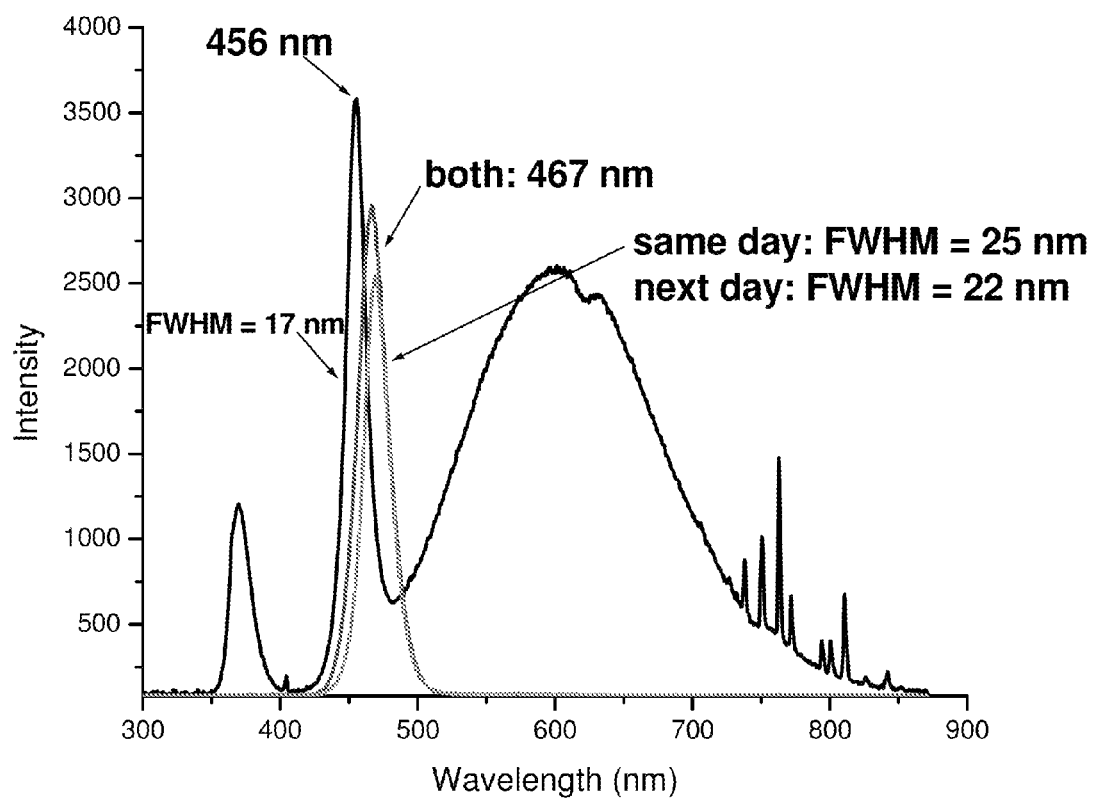
FIGS. 11a-11b are graphs depicting photoluminescence spectra of semiconductor nanocrystals.

CdS cores were overcoated by first combining the cores in a flask with oleylamine (7 mL), TOP (8 mL), and BTMPPA (1 mmol). After the flask contents were heated to 170° C., a shell precursor solution (diethyl zinc (86 mg), S(TMS)₂ (411 mg, 3-fold excess), Cd(Me)₂ (11 mg, 10 mol % relative to diethyl zinc), and TOP (7 mL)) was added at approximately 1 drop every three seconds. The resulting overcoated nanocrystals had an emission wavelength of 467 nm with a FWHM of 22 nm, and a QY of 37%. Photoluminescence spectra of the cores before overcoating and of the overcoated nanocrystals are presented in FIG. 11A.

Figure 11B:
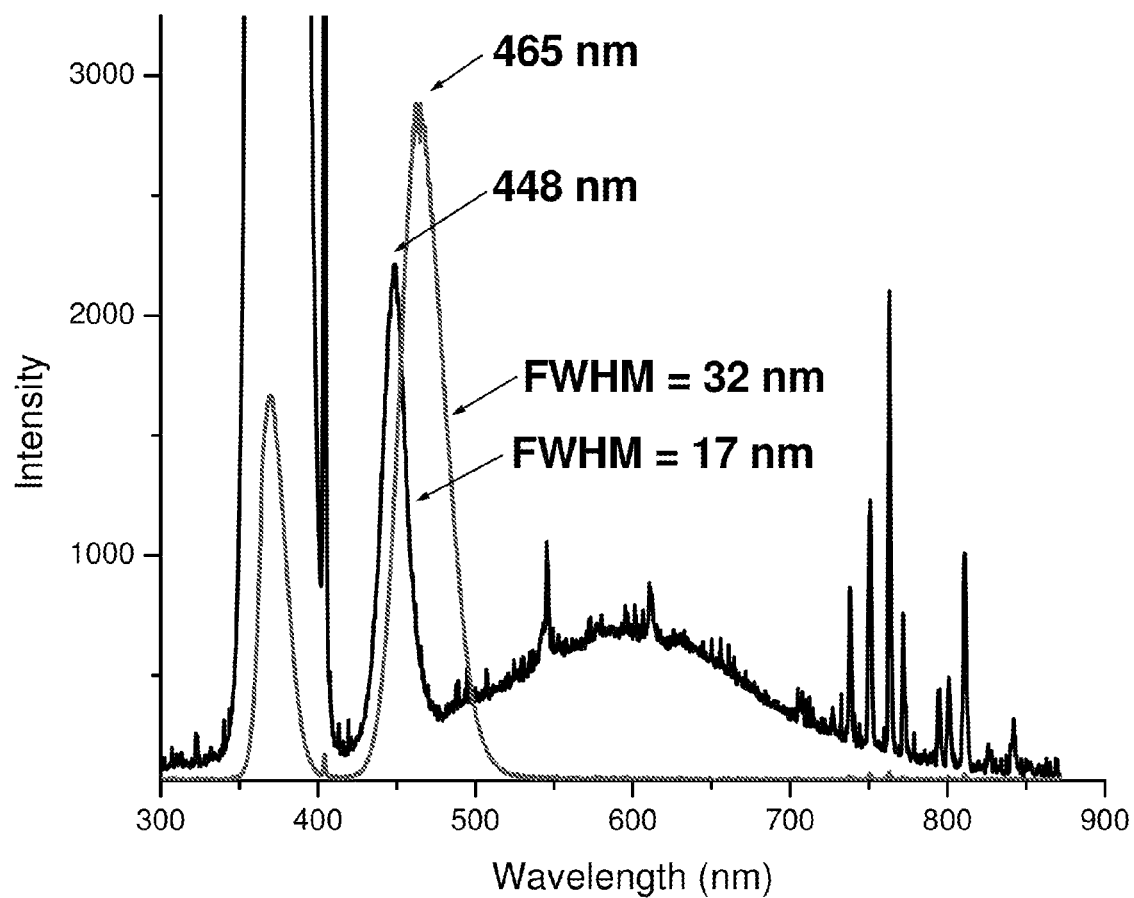

CdS cores were overcoated by first combining the cores in a flask with oleylamine (5 mL), TOP (5 mL), and BTMPPA (0.75 mmol). After the flask contents were heated to 170° C., a shell precursor solution (diethyl zinc (41 mg), S(TMS)₂ (198 mg, 3-fold excess), Cd(Me)₂ (7 mg, 10 mol % relative to diethyl zinc), and TOP (5 mL)) was added via a syringe pump over 2 hours, at a rate of 42 μL/min. The resulting overcoated nanocrystals had a FWHM of 32 nm and a QY of 50%. Photoluminescence spectra of the cores before overcoating and of the overcoated nanocrystals are presented in FIG. 11B.

Optical absorption spectra were acquired on a Hewlett-Packard 8453 diode array spectrometer. Photoluminescence spectra were acquired using a SPEX Fluorolog-2 spectrometer in a right angle collection configuration. The core CdS absorption spectra were taken with samples prepared by diluting the as-grown nanocrystal solutions in hexane, while all (CdS)ZnS core-shell optical characterization was done with samples that had been precipitated out of solution at least one time and redispersed in hexane. High-resolution transmission electron microscopy (HRTEM) to determine the shell thickness, crystallinity, and particle size distributions was performed on a JEOL-2010 electron microscope operated at 200 kV. Low resolution TEM was done on a JEOL 2000FX operated at 200 kV. Elemental analysis of the core-shell material was done using wavelength dispersive spectroscopy (WDS) on a JEOL JXA-733 Superprobes. Powder X-ray diffraction (PXRD) patterns were obtained on a Rigaku Ru300 X-ray diffractometer.

The nanocrystals can be suitable for a variety of applications, including those disclosed in copending and commonly owned U.S. patent application Ser. No. 09/156,863, filed Sep. 18, 1998, Ser. No. 09/160,454, filed Sep. 24, 1998, Ser. No. 09/160,458, filed Sep. 24, 1998, Ser. No. 09/350,956, filed Jul. 9, 1999, Ser. No. 10/400,908, filed Mar. 28, 2003, all of which are incorporated herein by reference in their entirety. For example, the nanocrystals can be used in optoelectronic devices including electroluminescent devices such as light emitting diodes (LEDs) or alternating current thin film electroluminescent devices (ACTFELDs).

Other embodiments are within the scope of the following claims.

What is claimed is:

1. A method of making a nanocrystal comprising contacting a monodisperse population of semiconductor nanocrystals with an M-containing compound, an X-donor, and an amine, at temperature sufficient to individually overcoat the nanocrystals, wherein the overcoated nanocrystals are substantially free of deep-trap emission sites, and the overcoated nanocrystals when excited emit blue light.

2. The method of claim 1, wherein the amine is a primary alkenyl amine.

3. The method of claim 1, wherein the amine is a $C_2$-$C_{20}$ primary alkenyl amine.

4. The method of claim 1, wherein the amine is oleylamine.

5. The method of claim 1, wherein the monodisperse population of semiconductor nanocrystals includes CdS nanocrystals.

6. The method of claim 1, wherein the monodisperse population of semiconductor nanocrystals has a rms deviation in diameter of no greater than 10%.

7. The method of claim 1, wherein the monodisperse population of semiconductor nanocrystals has a rms deviation in diameter of no greater than 5%.

8. The method of claim 5, wherein the M-containing compound includes Zn and the X-donor includes S.

9. The method of claim 1, wherein the overcoated nanocrystals when excited emit blue light with a quantum efficiency of at least 10%.

10. The method of claim 9, wherein the blue light has a peak wavelength shorter than 470 nm.

11. The method of claim 1, wherein the overcoated nanocrystals when excited emit blue light with a quantum efficiency of at least 30%.

12. The method of claim 1, wherein the overcoated nanocrystals when excited emit blue light with a quantum efficiency of at least 50%.

13. The method of claim 1, wherein the blue light has a full width at half maximum of not more than 40 nm.

14. The method of claim 1, wherein the blue light has a full width at half maximum of not more than 30 nm.

15. The method of claim 14, wherein the overcoated nanocrystals when excited emit blue light with a quantum efficiency of at least 20%.

16. The method of claim 1, wherein the blue light has a full width at half maximum of not more than 20 nm.

17. The method of claim 1, wherein the blue light has a peak wavelength shorter than 470 nm.

18. The method of claim 1, wherein the blue light has an intensity at least five times greater than an intensity of the deep trap emission.

19. The method of claim 1, wherein the blue light has an intensity at least ten times greater than an intensity of the deep trap emission.

20. The method of claim 1, wherein the blue light has an intensity at least twenty times greater than an intensity of the deep trap emission.

* * * * *

UNITED STATES PATENT AND TRADEMARK OFFICE
CERTIFICATE OF CORRECTION

PATENT NO. : 8,080,437 B2
APPLICATION NO. : 11/819413
DATED : December 20, 2011
INVENTOR(S) : Jonathan S. Steckel Page 1 of 1

It is certified that error appears in the above-identified patent and that said Letters Patent is hereby corrected as shown below:

Please delete the paragraph titled 'FEDERALLY SPONSORED RESEARCH' encompassing column 1, lines 16-19:

"The U.S. Government may have certain rightws in this invention pursuant to Contract No. DMR 0213282 by the NSF. and Contract DAAD-19-02-0002 by the U.S. Army Research Office."

and replace with:

--This invention was made with government support under Grant No. DAAD19-02-D-0002 awarded by the Army Research Office and under Grant No. DMR0213282 awarded by the National Science Foundation. The government has certain rights in this invention.--

Signed and Sealed this
Twentieth Day of November, 2012

David J. Kappos
*Director of the United States Patent and Trademark Office*